(12) United States Patent
Matsugai

(10) Patent No.: US 8,859,391 B2
(45) Date of Patent: Oct. 14, 2014

(54) SEMICONDUCTOR DEVICE, METHOD FOR MANUFACTURING SEMICONDUCTOR DEVICE, METHOD FOR LAMINATING SEMICONDUCTOR WAFERS, AND ELECTRONIC DEVICE

(75) Inventor: Hiroyasu Matsugai, Kanagawa (JP)

(73) Assignee: Sony Corporation (JP)

( * ) Notice: Subject to any disclaimer, the term of this patent is extended or adjusted under 35 U.S.C. 154(b) by 301 days.

(21) Appl. No.: 13/365,717

(22) Filed: Feb. 3, 2012

(65) Prior Publication Data

US 2012/0211849 A1 Aug. 23, 2012

(30) Foreign Application Priority Data

Feb. 22, 2011 (JP) ................................. 2011-036375

(51) Int. Cl.
*H01L 31/14* (2006.01)
*H01L 27/146* (2006.01)
*H01L 21/02* (2006.01)

(52) U.S. Cl.
CPC ...... *H01L 27/1464* (2013.01); *H01L 27/14683* (2013.01); *H01L 27/1462* (2013.01); *H01L 27/146* (2013.01); *H01L 2225/06558* (2013.01); *H01L 27/14632* (2013.01); *H01L 21/02021* (2013.01); *H01L 27/14634* (2013.01); *H01L 27/14685* (2013.01); *H01L 27/14689* (2013.01)
USPC ................. 438/455; 438/27; 438/28; 438/60; 438/64; 438/692; 438/694; 438/697; 257/431; 257/432; 257/433; 257/E31.11; 257/E31.127; 257/E21.532

(58) Field of Classification Search
None
See application file for complete search history.

(56) References Cited

U.S. PATENT DOCUMENTS

| 5,880,039 A * | 3/1999 | Lee ................................ 438/763 |
| 2004/0009649 A1* | 1/2004 | Kub et al. ...................... 438/459 |
| 2005/0068642 A1* | 3/2005 | Harada et al. .................. 359/819 |
| 2011/0079897 A1* | 4/2011 | Park et al. ...................... 257/737 |
| 2011/0233762 A1* | 9/2011 | Gruber et al. .................. 257/737 |

FOREIGN PATENT DOCUMENTS

| JP | 2007-088450 | 4/2007 |
| JP | 2010-245506 | 10/2010 |

* cited by examiner

*Primary Examiner* — Fei Fei Yeung Lopez
(74) *Attorney, Agent, or Firm* — Sheridan Ross P.C.

(57) ABSTRACT

A method for manufacturing a semiconductor device including: forming a wiring layer on a surface side of a first semiconductor wafer; forming a buried film so as to fill in a level difference on the wiring layer, the level difference being formed at a boundary between a peripheral region of the first semiconductor wafer and an inside region being on an inside of the peripheral region, and the level difference being formed as a result of a surface over the wiring layer in the peripheral region being formed lower than a surface over the wiring layer in the inside region, and making the surfaces over the wiring layer in the peripheral region and the inside region substantially flush with each other; and opposing and laminating the surfaces over the wiring layer formed in the first semiconductor wafer to a desired surface of a second semiconductor wafer.

18 Claims, 20 Drawing Sheets

CHIP SECTION

← CHIP SECTION →

SEMICONDUCTOR DEVICE, METHOD FOR MANUFACTURING SEMICONDUCTOR DEVICE, METHOD FOR LAMINATING SEMICONDUCTOR WAFERS, AND ELECTRONIC DEVICE

BACKGROUND

The present technology relates to a semiconductor device such as a solid-state imaging device or the like formed by laminating wafers, a method for manufacturing the semiconductor device, a method for laminating semiconductor wafers, and an electronic device including the solid-state imaging device.

In related art, a process of manufacturing a semiconductor device typified by a solid-state imaging device or the like includes a process of laminating two different wafers. For example, in a case of a backside illumination type solid-state imaging device described in Japanese Patent Laid-Open No. 2007-88450, there is a process of laminating a wafer having a pixel region and a peripheral circuit region formed therein to a supporting substrate. In addition, in a case of a solid-state imaging device described in Japanese Patent Laid-Open No. 2010-245506, there is a process of bonding a wafer having a pixel region formed therein to a wafer having a logic circuit formed therein such that circuit surfaces are in contact with each other.

For example, when two wafers are bonded to each other by using a plasma bonding technique, a silanol group (Si—OH group) is formed by applying plasma irradiation to a $SiO_2$ film formed on the bonding surfaces of the wafers. Next, the laminating surfaces of the wafers are opposed to each other, and bonded to each other by a Van der Waals force by pressing a part of the wafers. Thereafter, in order to further enhance adhesion at a bonding interface, control at a molecular level in applying 400° C./60-min heat treatment and effecting dehydration condensation reaction of the silanol groups with each other, for example, is necessary for the laminating surfaces of the wafers. Thus, when the laminating surfaces of the wafers have projections and depressions, bonding at a molecular level cannot be performed.

In addition, in lamination using an adhesive, when an adhesive having high viscosity and high hardness is used, and the laminating surfaces of the wafers have projections and depressions, the adhesive does not enter spaces formed by the projections and the depressions, so that adhesion between the laminated wafers cannot be maintained.

Thus, in a case where there is a process of laminating wafers to each other, the flatness of the laminating surfaces of the wafers is very important, and bonding cannot be performed when the laminating surfaces have a local level difference caused by a wiring pattern or the like. A method for manufacturing a semiconductor device in the past which semiconductor device is formed by laminating two wafers to each other and which has wiring layers in the vicinity of the laminating surfaces of the wafers will be described with reference to FIGS. 12A to 12G.

FIGS. 12A to 12G are process diagrams showing a method for manufacturing a semiconductor device in the past. FIGS. 12A to 12G show a section of a region including a boundary part between a peripheral region 120 of a semiconductor wafer 113 and an inside region 121 of the semiconductor wafer 113 in which inside region transistors and the like forming a circuit are formed. As shown in FIG. 12A, a plurality of MOS transistors Tr composed of source/drain regions 112 and a gate electrode 103 are formed in a state of being isolated from each other by element isolation regions 114 in the inside region 121 forming a chip section on the surface side of the wafer 113.

First, a first layer of interlayer insulating film 104 is formed on the semiconductor wafer 113 made of silicon, and wiring grooves 105 are formed in a predetermined pattern in the upper surface of the interlayer insulating film 104. Thereafter, a wiring material 106 made of Cu is formed on the entire surface of the interlayer insulating film 104 including the wiring grooves 105. Then, after the wiring material is formed, a first layer of wiring 107 is formed by removing the wiring material on the surface of the interlayer insulating film 104 such that the wiring material is left only within the wiring grooves 105.

At this time, in order to prevent exposure of Cu, all of the wiring material in a certain region from an edge of the wafer is locally removed from the peripheral region 120 of the semiconductor wafer 113 by a method referred to as Cu EBR (Edge Bead Removal). The EBR process can remove the wiring material in the peripheral region 120 as shown in FIG. 12B by discharging a solvent from a dedicated discharge nozzle to the peripheral region 120 of the semiconductor wafer 113. As a result of the wiring material in the peripheral region 120 being thus removed, nothing is filled into the wiring grooves 105 formed in the peripheral region 120, and thus empty grooves are formed.

Thereafter, an interlayer insulating film 104 is formed on the wiring 107. Then, in the peripheral region 120, the wiring grooves (hereinafter empty grooves 105) in which the wiring 107 is not formed remain, and thus the interlayer insulating film 104 is absorbed by the empty grooves. As a result, as shown in FIG. 12C, the surface of the interlayer insulating film 104 has a level difference at a boundary between the inside region 121 and the peripheral region 120. Empty grooves 105 are also formed in the peripheral region 120 when a second layer of wiring 109 is formed. Thereafter, as shown in FIG. 12D, further forming an interlayer insulating film 104 and a third layer of wiring 110 increasingly enlarges the level difference of the surface of the wiring layer which level difference is formed at the boundary between the inside region 121 and the peripheral region 120.

Thus, in the process of forming the wiring layer in the past, empty grooves 105 are formed on the periphery of the wafer each time wiring is formed. Thus, as a result, regions from which the wiring is removed in the peripheral region 120 of the semiconductor wafer 113 have a small film thickness as compared with the inside region 121 in which the wiring is formed, and a large level difference is formed at the boundary between the inside region 121 and the peripheral region 120. For example, when a wiring layer having four layers of wiring is formed, there is a large level difference of 800 nm to 1000 nm between the central part and the peripheral region of the semiconductor wafer. When this surface is used as a laminating surface, lamination cannot be performed in the peripheral region.

In the past, it has been a common practice to form a P—$SiO_2$ (plasma silicon oxide) film 111 having such a thickness as to fill in the level difference on the wiring layer by using a CVD (Chemical Vapor Deposition) method, as shown in FIG. 12E, and planarize the surface of the P—$SiO_2$ film 111 by polishing the surface of the P—$SiO_2$ film 111 by using a CMP (Chemical Mechanical Polishing) method, as shown in FIG. 12F. However, the film formed by the CVD method is formed along the shape of the surface. Thus, even when the film is formed with such a thickness as to fill in the level difference, the film is formed in a state of conforming to the level difference, so that the level difference is not eliminated.

Further, the peripheral (edge) part of the wafer may be polished more because of an edge over-polishing profile specific to CMP. Then, as shown in FIG. 12G, when two semiconductor wafers 113 are laminated to each other with the wiring layers of the semiconductor wafers 113 as laminating surfaces, the semiconductor wafers 113 cannot be laminated to each other in the peripheral regions 120 of the semiconductor wafers 113 due to an effect of global level differences at the surfaces of the wafers. Therefore a bonding defect occurs.

FIGS. 12A to 12G represent an example in which wiring layers having a level difference on the periphery are bonded to each other. However, even in a case where one wafer is flat, a bonding defect occurs as in FIG. 12G when the surface of the wiring layer formed in the other wafer has a level difference. As shown in FIG. 12G, when a bonding defect occurs on the peripheries of the wafers, strength at the bonding surfaces cannot be maintained. Then, defects such as film peeling, chipping, and the like may occur in a polishing process after lamination and a process of dividing the wafers into each chip. Therefore reliability cannot be maintained.

In addition, while the above description mentions the local removal of the wiring in the peripheral region of the semiconductor wafer as a cause of a decrease in thickness of the wiring layer in the peripheral region, the peripheral region of the wafer tends to have the oxide film thereof etched, and thus tends to be reduced in thickness in device manufacturing. Thus, the semiconductor manufacturing process has factors in reducing the thickness of the wiring layer and the oxide film in the peripheral region of the wafer, so that the surface has a level difference.

SUMMARY

In view of the above points, it is desirable to provide a semiconductor device whose reliability is improved as peeling between wafers, chipping, and the like are prevented by improving the adhesion of laminating surfaces in the semiconductor device, the semiconductor device being formed by laminating substrates to each other. It is also desirable to provide an electronic device using the semiconductor device.

A method for manufacturing a semiconductor device according to an embodiment of the present technology first forms a wiring layer on a surface side of a first semiconductor wafer. Next, a buried film is formed so as to fill in a level difference on the wiring layer, the level difference being formed at a boundary between a peripheral region of the first semiconductor wafer and an inside region of the first semiconductor wafer, the inside region being on an inside of the peripheral region. Then, surfaces over the wiring layer in the peripheral region and the inside region are made substantially flush with each other. Next, the surfaces over the wiring layer formed in the first semiconductor wafer and a desired surface of a second semiconductor wafer are opposed to each other and laminated to each other.

The method for manufacturing the semiconductor device according to the embodiment of the present technology forms the buried film, whereby the level difference formed on the wiring layer is eliminated. The whole surfaces over the wiring layer from the peripheral region to the inside region are thereby made flat. Thus, when the surfaces over the wiring layer are used as a laminating surface, the first semiconductor wafer and the second semiconductor wafer are bonded in close contact with each other also in the peripheral region.

A semiconductor device according to an embodiment of the present technology is formed by laminating a first semiconductor wafer and a second semiconductor wafer to each other after a level difference formed on a wiring layer in the first semiconductor wafer is eliminated. Thus, bonding strength between the first semiconductor wafer and the second semiconductor wafer is improved. Thereby, peeling between the wafers and chipping during manufacturing are prevented, so that reliability is improved.

A method for laminating semiconductor wafers according to an embodiment of the present technology first forms a wiring layer on a surface side of a first semiconductor wafer. Next, a buried film is formed so as to fill in a level difference on the wiring layer, the level difference being formed at a boundary between a peripheral region of the first semiconductor wafer and an inside region of the first semiconductor wafer, the inside region being on an inside of the peripheral region. Then, surfaces over the wiring layer in the peripheral region and the inside region are made substantially flush with each other. Next, the surfaces over the wiring layer formed in the first semiconductor wafer and a desired surface of a second semiconductor wafer are opposed to each other and laminated to each other.

In the method for laminating the semiconductor wafers, the whole of the laminating surface of the first semiconductor wafer is planarized from the peripheral region to the inside region. Thus, the whole surface of the first semiconductor wafer can be laminated in close contact with the second semiconductor wafer.

An electronic device according to an embodiment of the present technology includes an optical lens, a solid-state imaging device as described above for receiving incident light condensed by the optical lens, and a signal processing circuit for processing an output signal output from the solid-state imaging device.

According to the present technology, an entire surface over a wiring layer formed in a semiconductor wafer is planarized. Thus, when the semiconductor wafer is laminated to another semiconductor wafer with the surface on the side of the wiring layer as a laminating surface, the semiconductor wafer can be laminated in close contact with the other semiconductor wafer as far as a peripheral region. It is thereby possible to obtain a semiconductor device of high reliability in which semiconductor device peeling between wafers, chipping, and the like are prevented.

DETAILED DESCRIPTION OF THE PREFERRED EMBODIMENTS

An example of a semiconductor device such as a solid-state imaging device or the like and an electronic device according to embodiments of the present technology will hereinafter be described with reference to the drawings. Embodiments of the present technology will be made in the following order. It is to be noted that the present technology is not limited to the following examples.

1. First Embodiment: MOS (Metal Oxide Semiconductor) Type Solid-State Imaging Device
   1-1 General Constitution of Solid-State Imaging Device
   1-2 Constitution of Principal Parts of Solid-State Imaging Device and Manufacturing Method
2. Second Embodiment: Backside Illumination Type Solid-State Imaging Device
3. Third Embodiment: Backside Illumination Type Solid-State Imaging Device
4. Fourth Embodiment: Semiconductor Device
5. Fifth Embodiment: Electronic Device <1. First Embodiment: MOS Type Solid-State Imaging Device>

Figure 1:
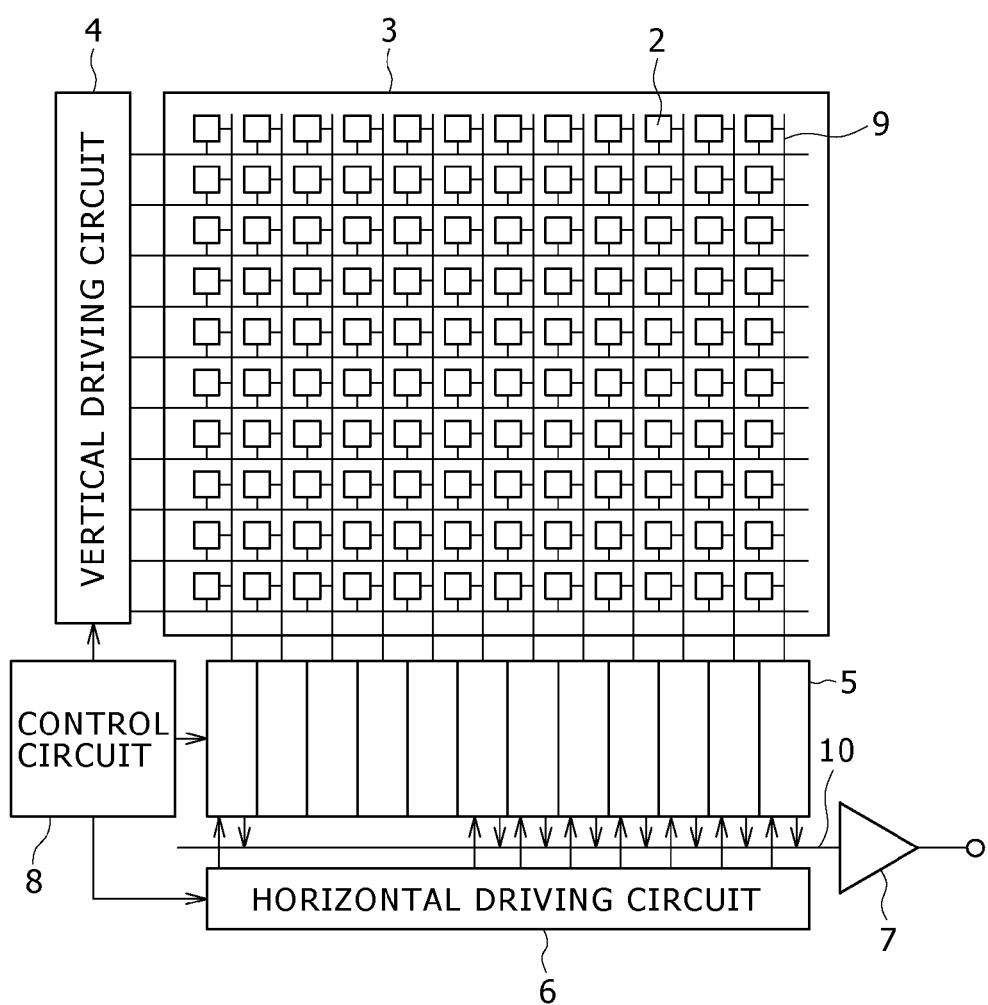
FIG. 1 is a diagram showing a general configuration of a MOS type solid-state imaging device according to an embodiment of the present technology.

FIG. 1 shows a schematic constitution of the whole of a MOS type solid-state imaging device applied to a semiconductor device according to an embodiment of the present technology. This MOS type solid-state imaging device is applied to a solid-state imaging device according to each embodiment to be described in the following.

The solid-state imaging device 1 according to an example of the present embodiment includes a pixel region 3 in which pixels 2 including a plurality of photoelectric conversion sections are regularly arranged in the form of a two-dimensional array in a semiconductor wafer not shown in the figure, for example a silicon substrate, and a peripheral circuit section. The pixels 2 include for example a photodiode serving as a photoelectric conversion section and a plurality of pixel transistors (so-called MOS transistors). The plurality of pixel transistors can be formed by three transistors, for example a transfer transistor, a reset transistor, and an amplifying transistor. In addition, the plurality of pixel transistors can also be formed by four transistors with the addition of a selecting transistor. An equivalent circuit of a unit pixel is similar to an ordinary equivalent circuit, and therefore detailed description thereof will be omitted. Each of the pixels 2 can be formed as one unit pixel. In addition, the pixels 2 can have a shared pixel structure. In this shared pixel structure, a plurality of photodiodes share a floating diffusion forming a transfer transistor and other transistors than the transfer transistor.

The peripheral circuit section includes a vertical driving circuit 4, a column signal processing circuit 5, a horizontal driving circuit 6, an output circuit 7, a control circuit 8, and the like.

The control circuit 8 receives an input clock and data indicating an operation mode and the like, and outputs data such as internal information of the solid-state imaging device and the like. Specifically, the control circuit 8 generates a clock signal and a control signal serving as a reference for the operation of the vertical driving circuit 4, the column signal processing circuit 5, the horizontal driving circuit 6, and the like on the basis of a vertical synchronizing signal, a horizontal synchronizing signal, and a master clock. The control circuit 8 then inputs these signals to the vertical driving circuit 4, the column signal processing circuit 5, the horizontal driving circuit 6, and the like.

The vertical driving circuit 4 is formed by a shift register, for example. The vertical driving circuit 4 selects pixel driving wiring, supplies a pulse for driving pixels to the selected pixel driving wiring, and thereby drives the pixels in a row unit. Specifically, the vertical driving circuit 4 sequentially selects and scans each pixel 2 of the pixel region 3 in row units in a vertical direction. Then, a pixel signal based on a signal charge generated according to an amount of light received in for example a photodiode serving as a photoelectric conversion element of each pixel 2 is supplied to the column signal processing circuit 5 via a vertical signal line 9.

The column signal processing circuit 5 is arranged for example for each column of the pixels 2. The column signal processing circuit 5 subjects signals output from pixels 2 of one row to signal processing such as noise removal and the like in respective pixel columns. Specifically, the column signal processing circuit 5 performs signal processing such as CDS (Correlated Double Sampling) for removing fixed pattern noise unique to the pixels 2, signal amplification, AD conversion, and the like. A horizontal selecting switch (not shown) is provided so as to be connected between an output stage of the column signal processing circuit 5 and a horizontal signal line 10.

The horizontal driving circuit 6 is formed by a shift register, for example. The horizontal driving circuit 6 selects each part of the column signal processing circuit 5 in order by sequentially outputting a horizontal scanning pulse, and makes a pixel signal output from each part of the column signal processing circuit 5 to the horizontal signal line 10.

The output circuit 7 subjects the signal sequentially supplied from each part of the column signal processing circuit 5 to the output circuit 7 through the horizontal signal line 10 to signal processing, and then outputs a resulting signal. For example, the output circuit 7 may perform only buffering, or may perform black level adjustment, column variation correction, various digital signal processing, and the like.

Figure 2A:
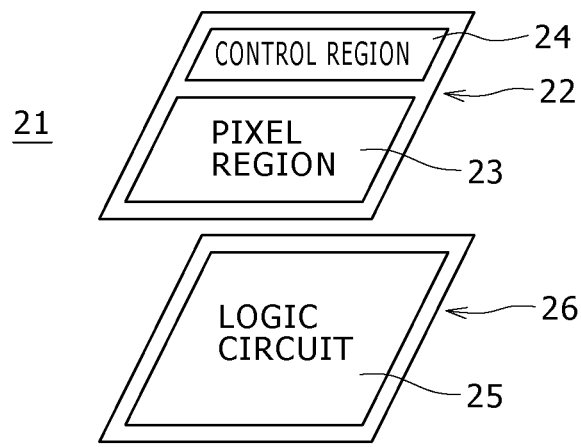
FIGS. 2A and 2B are diagrams showing structures of MOS type solid-state imaging devices according to embodiments of the present technology.

A structure of the MOS type solid-state imaging device according to the present embodiment will next be described. As shown in FIG. 2A, a MOS type solid-state imaging device 21 according to an example of the present embodiment has a pixel region 23 and a control region 24 in a first semiconductor chip section 22, and has a logic circuit 25 including a signal processing circuit for signal processing in a second semiconductor chip section 26. The MOS type solid-state imaging device 21 is formed as one semiconductor chip with the first semiconductor chip section 22 and the second semiconductor chip section 26 electrically connected to each other.

Figure 2B:
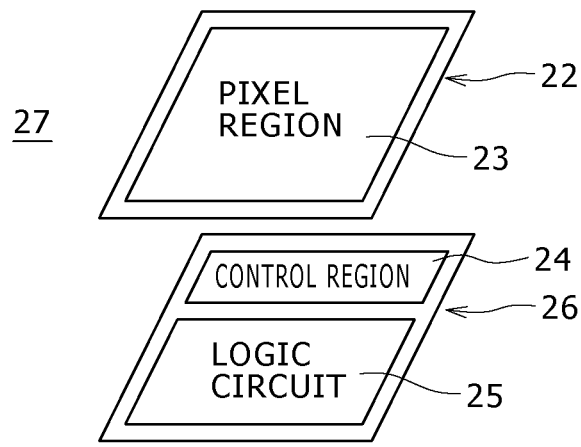

As shown in FIG. 2B, a MOS type solid-state imaging device 27 in another example of the embodiment of the present technology has a pixel region 23 in a first semiconductor chip section 22, and has a control region 24 and a logic circuit 25 including a signal processing circuit in a second semiconductor chip section 26. The MOS type solid-state imaging device 27 is formed as one semiconductor chip with the first semiconductor chip section 22 and the second semiconductor chip section 26 electrically connected to each other.

The MOS type solid-state imaging devices according to the above-described examples of the embodiment have a structure of different kinds of semiconductor chips laminated to each other. On the basis of the above description, a concrete constitution of principal parts of a solid-state imaging device according to an example of the present embodiment and a method for manufacturing the solid-state imaging device will be described in the following.

[1-2 Constitution of Principal Parts of Solid-State Imaging Device and Manufacturing Method]

A backside illumination type solid-state imaging device according to an example of the present embodiment will be described together with a method for manufacturing the solid-state imaging device with reference to FIG. 3 and FIGS. 4A to 4K.

Figure 3:
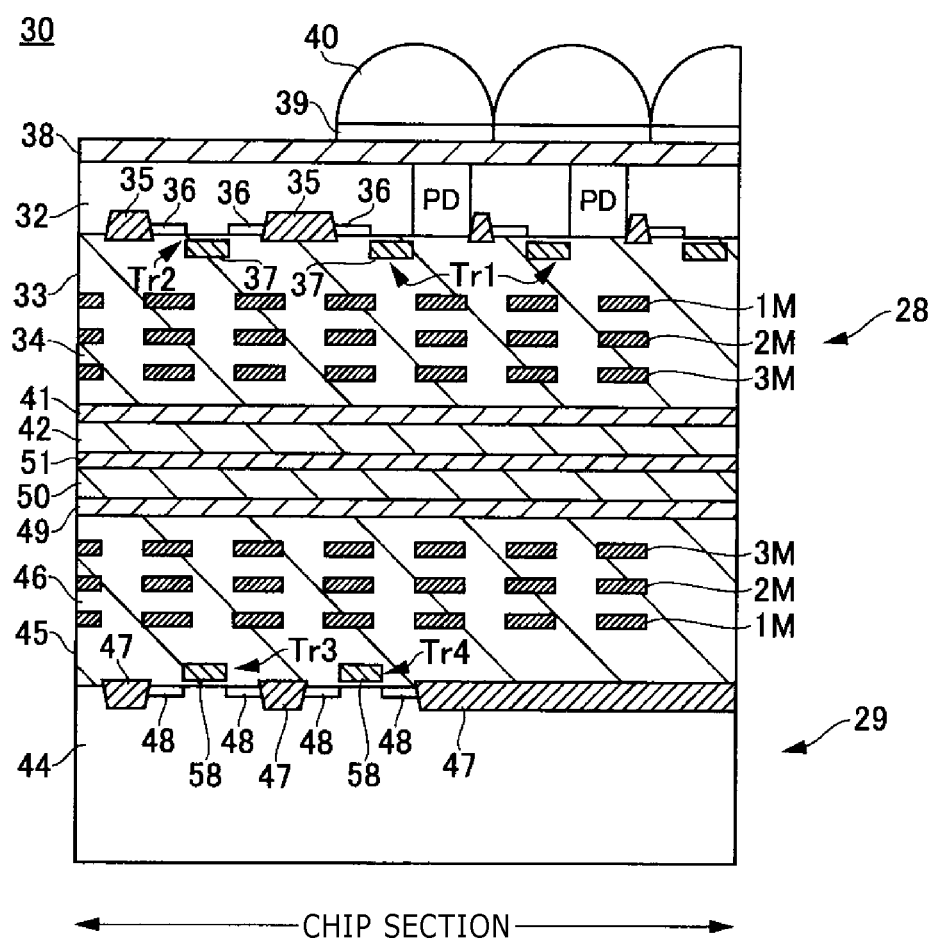
FIG. 3 is a sectional view of a constitution of a solid-state imaging device according to a first embodiment of the present technology.

FIG. 3 is a schematic sectional structural view of the solid-state imaging device 30 according to the example of the present embodiment when the solid-state imaging device 30 is completed after wafers are divided into each chip. The solid-state imaging device 30 according to the example of the present embodiment has a first semiconductor chip section 28 including a pixel region and a control region and a second semiconductor chip section 29 including a logic circuit, the first semiconductor chip section 28 and the second semiconductor chip section 29 being vertically laminated to each other and bonded to each other by plasma bonding.

A method for manufacturing the solid-state imaging device 30 according to the example of the present embodiment will be described with reference to FIGS. 4A to 4K.

The manufacturing process diagrams of FIGS. 4A to 4K show a section of a region including a boundary part between a peripheral region of a semiconductor wafer and an inside region of the semiconductor wafer in which inside region a photoelectric conversion section forming a pixel as well as transistors and the like forming a circuit is formed. In this case, the peripheral region in the semiconductor wafer is a region not corresponding to the semiconductor chip sections, and is a region other than a theoretical yield in which region each piece of wiring is removed to be prevented from being exposed from the periphery of the wafer in a stage of formation of a wiring layer. The inside region refers to a region on the inside of the peripheral region, and refers to a region in which the wiring of the wiring layer is not removed.

Figure 4A:
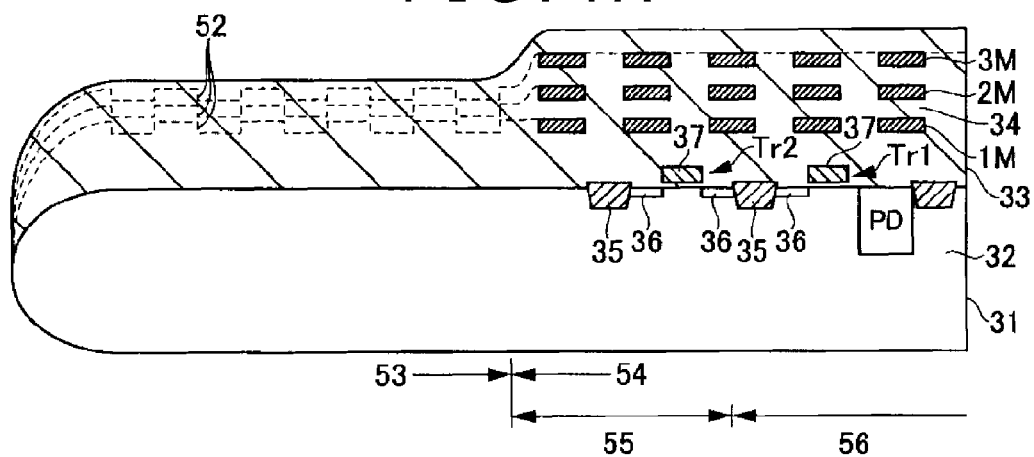
FIGS. 4A to 4K are process diagrams of a method for manufacturing the solid-state imaging device according to the first embodiment of the present technology.

In the example of the present embodiment, first, as shown in FIG. 4A, an image sensor, or a pixel region 56 and a control region 55, is formed in each chip section of a first semiconductor wafer 31.

A photodiode (PD) serving as a photoelectric conversion section of each pixel is formed in the pixel region 56 in the inside region 54 forming each chip section of the first semiconductor wafer 31 made of a silicon substrate, and source/drain regions 36 of each pixel transistor are formed in a semiconductor well region 32 of the inside region 54. The semiconductor well region 32 is formed by introducing an impurity of a first conductivity type, for example a p-type. The source/drain regions 36 are formed by introducing an impurity of a second conductivity type, for example an n-type. The photodiode (PD) and the source/drain regions 36 of each pixel transistor are formed by ion implantation from the surface of the substrate.

Though not shown in the figures, the photodiode (PD) includes an n-type semiconductor region and a p-type semiconductor region on the side of the substrate surface. A gate electrode 37 is formed on the substrate surface forming the pixel with a gate insulating film interposed between the gate electrode 37 and the substrate surface. The gate electrode 37 and a pair of source/drain regions 36 form a pixel transistor Tr1. In FIG. 4A, a plurality of pixel transistors are represented by one pixel transistor Tr1. The pixel transistor Tr1 adjacent to the photodiode (PD) corresponds to a transfer transistor as a signal charge reading section. The source/drain region 36 of the pixel transistor Tr1 corresponds to a floating diffusion (FD). The unit pixels are isolated from each other by element isolation regions 35.

On the other hand, the MOS transistor Tr2 for driving each pixel is formed on the side of the control region 55 of the first semiconductor wafer 31. The MOS transistor Tr2 formed in the control region 55 is formed in a similar manner to the MOS transistor in the pixel region 56. A plurality of MOS transistors are also formed in the control region 55. However, in FIG. 4A, the plurality of MOS transistors are represented by the MOS transistor Tr2.

Next, a wiring layer 33 including a plurality of layers (three layers in FIG. 4A) of wiring 1M to 3M formed therein is formed on the surface of the first semiconductor wafer 31 by alternately repeating the formation of an interlayer insulating film 34 and the formation of the wiring 1M to 3M made of Cu. The formation of the wiring 1M to 3M made of Cu is similar to the formation of the wiring layer in the past as described with reference to FIGS. 12A to 12G. The wiring 1M to 3M made of Cu is formed by embedding a wiring material of Cu in groove parts pattern-formed on the interlayer insulating films 34. In addition, though not shown in FIG. 4A, a contact part electrically connected to transistors formed in the first semiconductor wafer 31 and a contact part for establishing connection between desired pieces of wiring are formed. When the contact parts are formed, contact holes are formed in desired positions of the interlayer insulating films 34, and a conductive material is embedded in the contact holes.

In the example of the present embodiment, in a stage of formation of the wiring layer 33, the wiring 1M to 3M other than the theoretical yield which wiring is formed in the peripheral region 53 is locally removed each time each layer of wiring 1M to 3M is formed in order to prevent exposure of Cu as a wiring material from the periphery of the first semiconductor wafer 31. The removal of the wiring 1M to 3M in the peripheral region 53 is as described with reference to FIGS. 12A to 12G. The wiring 1M to 3M in the peripheral region 53 is removed by using the EBR method each time the wiring 1M to 3M is formed. Thereby, in the peripheral region 53, empty grooves 52 are formed each time the wiring 1M to 3M is removed, the surface of the wiring layer 33 in the peripheral region 53 is depressed due to the empty grooves 52, and a level difference occurs in a boundary part between the peripheral region 53 and the inside region 54 as a region on the inside of the peripheral region 53.

Figure 4B:
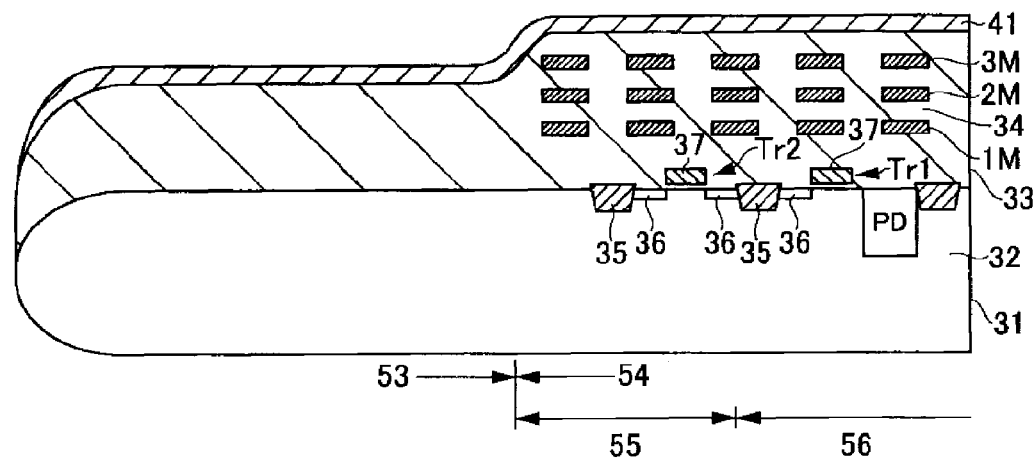

Next, as shown in FIG. 4B, a passivation film 41 (protective film) is formed on the entire surface of the wiring layer 33. This passivation film 41 protects the wiring 1M to 3M, and can reduce small projections and depressions formed in the surface of the wiring layer 33. However, the passivation film 41 is formed along the shape of the surface because of the large level difference at the boundary between the peripheral region 53 and the inside region 54. Therefore the global level difference at the boundary part between the peripheral region 53 and the inside region 54 remains as a result of the formation of the passivation film 41.

Figure 4C:
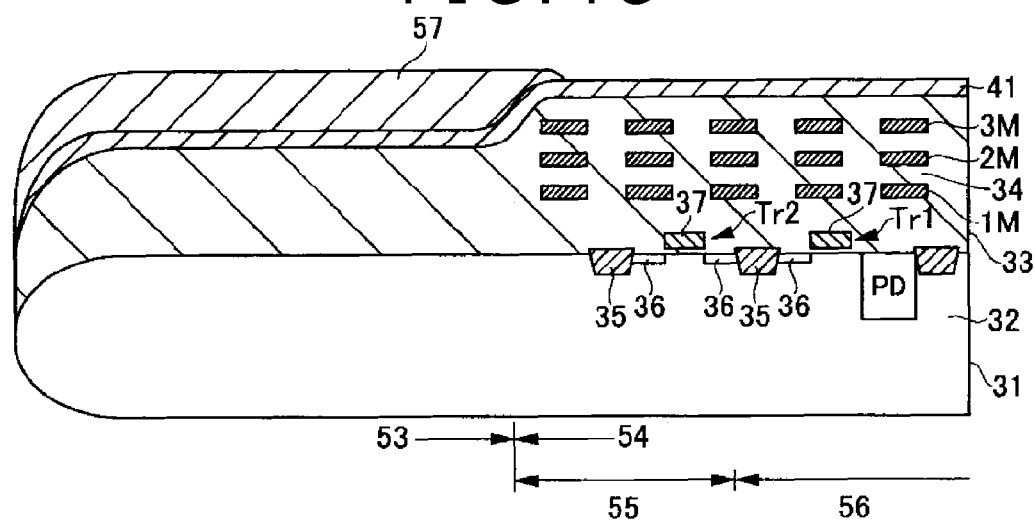

Next, as shown in FIG. 4C, a buried film 57 for filling the level difference between the peripheral region 53 and the inside region 54 is formed by locally applying a coating material to the upper part of the passivation film 41 only in the peripheral region 53 of the first semiconductor wafer 31. The buried film 57 is formed by applying the coating material until the surface of the buried film 57 has substantially the same height as the surface of the passivation film 41 in the inside region 54. For example, SOG (Spin On Glass), SOD (Spin On Dielectric), or a low-k material can be used as the coating material. Thus forming the buried film 57 locally in the peripheral region 53 of the first semiconductor wafer 31 eases the global level difference due to the wiring pattern formed on the surface side of the first semiconductor wafer 31.

Figure 4D:
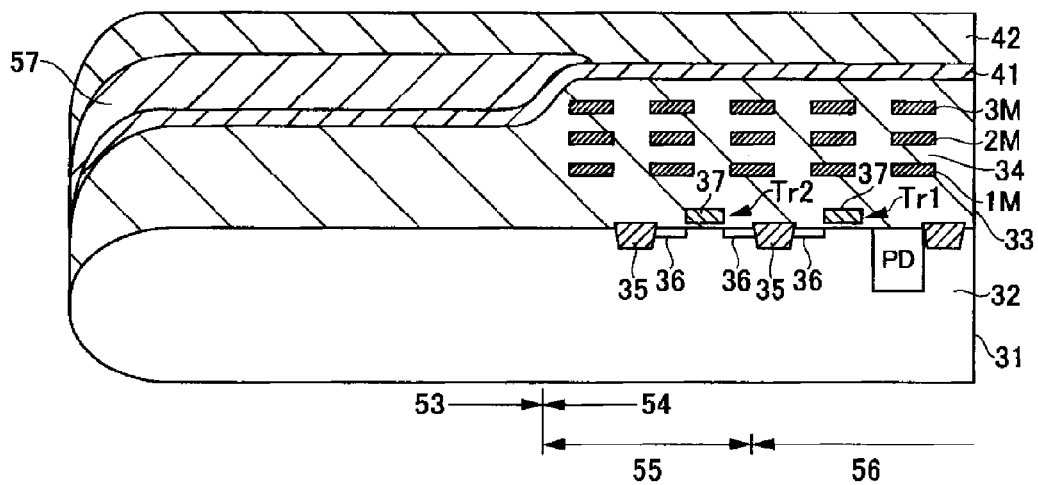

Next, as shown in FIG. 4D, a film 42 to be polished which film is made of a P—$SiO_2$ film is formed to a thickness of 100 to 2000 nm on the entire surface of the first semiconductor wafer 31 which entire surface includes the passivation film 41 and the buried film 57, using a plasma CVD (Chemical Vapor Deposition) method. The film 42 to be polished is to be polished in a next process. In the example of the present embodiment, the film 42 to be polished is formed by the plasma CVD method. However, the method for forming the film is not particularly limited even when the film 42 to be polished is a thin film formed by a thermal CVD method, a sputtering method, an evaporation method, an ALD (Atomic Layer Deposition) method, or the like as long as the thin film is a kind of polishable film. In addition, while a P—$SiO_2$ film is formed in the present example, it suffices for the film to be a polishable film. In addition to the $SiO_2$ film, TEOS (Tetraethyl Orthosilicate), SiN, SiCOH, SiCN, SiC, BPSG (Boron Phosphorus Silicon Glass), PSG (Phosphorus Silicon Glass), or the like can be used. Further, while the film 42 to be polished is formed in the example of the present embodiment, the film 42 to be polished does not necessarily need to be formed. It may be possible to proceed to the next process without forming the film 42 to be polished.

Figure 4E:
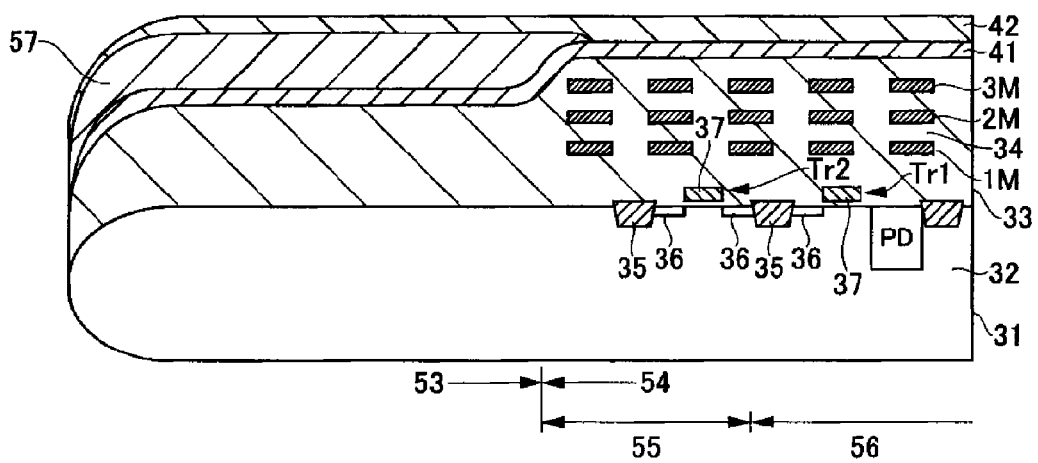

Then, as shown in FIG. 4E, the surface of the film 42 to be polished is polished and planarized by using a CMP method. The entire surface over the wiring layer 33 formed in the first semiconductor wafer 31 is thereby planarized.

In the processes thus far, the pixel region 56 and the control region 55 are formed in the first semiconductor wafer 31, and the wiring layer 33 is formed on the surface side of the first semiconductor wafer 31.

Figure 4F:
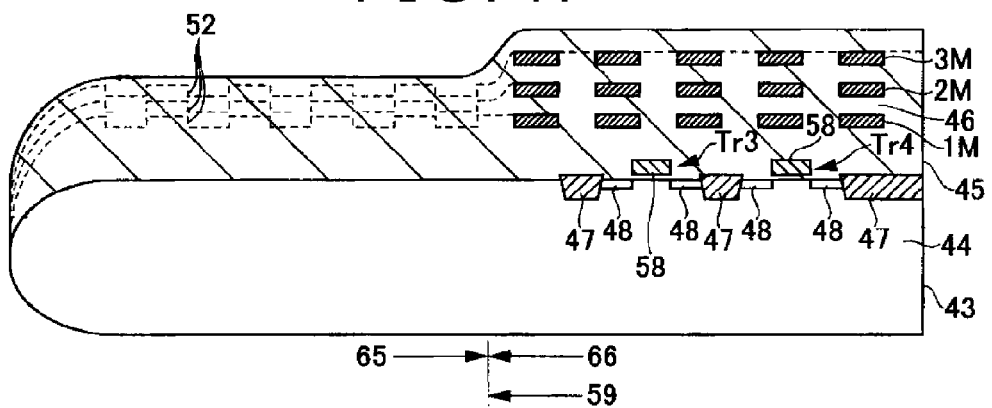

Meanwhile, as shown in FIG. 4F, a logic circuit 59 including a signal processing circuit for processing a signal obtained from a pixel is formed in an inside region 66 forming each chip section in a second semiconductor wafer 43 made of silicon, for example. Specifically, a plurality of MOS transistors Tr3 and Tr4 forming the logic circuit 59 are formed so as to be isolated from each other by element isolation regions 47 in a p-type semiconductor well region 44 on the surface side of the second semiconductor wafer 43. In this case, the plurality of MOS transistors are represented by the MOS transistors Tr3 and Tr4. Each of the MOS transistors Tr3 and Tr4 includes a pair of n-type source/drain regions 48 and a gate electrode 58 formed on a gate insulating film. The logic circuit 59 can be formed by a CMOS transistor.

Next, as in the case of the first semiconductor wafer 31 shown in FIG. 4A, a wiring layer 45 including a plurality of layers (three layers in FIG. 4F) of wiring 1M to 3M formed therein is formed on the surface side of the second semiconductor wafer 43 by alternately repeating the formation of an interlayer insulating film 46 and the formation of the wiring 1M to 3M. Also in the case of the second semiconductor wafer 43, the wiring 1M to 3M other than the theoretical yield which wiring is formed in a peripheral region 65 of the second semiconductor wafer 43 is locally removed. Thus, also in the case of the second semiconductor wafer 43, empty grooves 52 are formed in the wiring layer 45 in the peripheral region 65, and the surface of the wiring layer 45 has a large level difference formed in a boundary part between the peripheral region 65 and an inside region 66 in which the logic circuit 59 is formed.

Figure 4G:
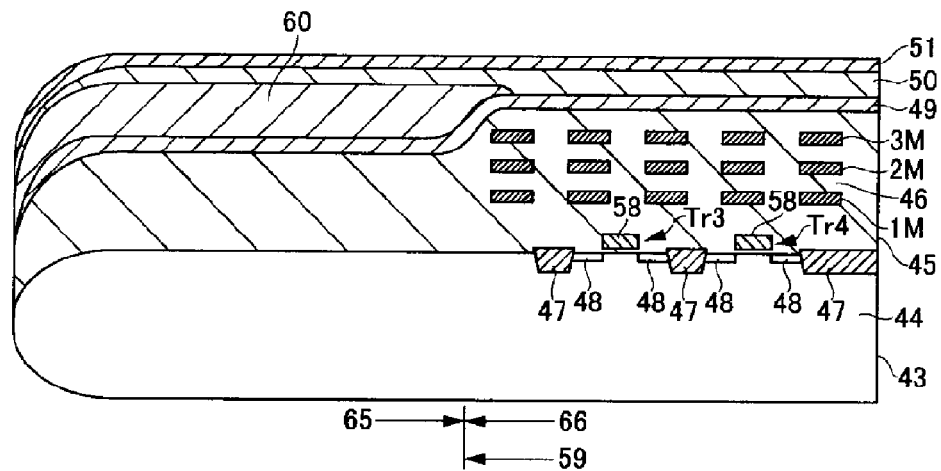

Then, as shown in FIG. 4G, also in the case of the second semiconductor wafer 43, a passivation film 49, a buried film 60, and a film 50 to be polished are formed on the wiring layer 45, and thereafter the surface of the film 50 to be polished is polished by a CMP method, as in the processes shown in FIGS. 4B to 4E. Thereby, the global level difference formed at the boundary between the peripheral region 65 and the inside region 66 is eliminated, and an entire surface over the wiring layer 45 formed in the second semiconductor wafer 43 is made flat.

After the surface over the wiring layer 45 in the second semiconductor wafer 43 is planarized, as shown in FIG. 4G, a bonding aid film 51 is formed to a thickness of 100 nm, for example, on the upper surface of the film 50 to be polished. The bonding aid film 51 includes a SiN film formed by introducing silane and nitrogen, a SiCN film formed by introducing 3TS (trimethylsilane) or 4TS (tetramethylsilane) and nitrogen, a $SiO_2$ film formed by introducing silane and oxygen, a SiCOH film formed by introducing 3TS (trimethylsilane) or 4TS (tetramethylsilane) and oxygen, and the like. This bonding aid film 51 is formed to aid in bonding when the first semiconductor wafer 31 and the second semiconductor wafer 43 are plasma-bonded to each other. Thus, the bonding aid film 51 may be formed on the surface over the wiring layer 33 formed in the first semiconductor wafer 31, or the bonding aid film 51 may be formed on the surfaces of both of the first semiconductor wafer 31 and the second semiconductor wafer 43. While the formation of the bonding aid film 51 improves the reliability of the bonding, the bonding aid film 51 is not necessarily required, and the bonding aid film 51 may not be formed.

Then, the surface over the wiring layer 33 formed in the first semiconductor wafer 31 and the surface over the wiring layer 45 formed in the second semiconductor wafer 43 are irradiated with oxygen plasma for 60 seconds at a frequency of 13.56 MHz, a pressure of 10 Pa, and a power of 100 W, for example, so that the surfaces are modified. Thereafter, the surfaces are cleaned for 30 seconds with a pure water with 18 $M\Omega$ or more, whereby a silanol group (Si—OH group) is formed in the surface over the wiring layer 33 formed in the first semiconductor wafer 31 and the surface over the wiring layer 45 formed in the second semiconductor wafer 43.

Figure 4H:
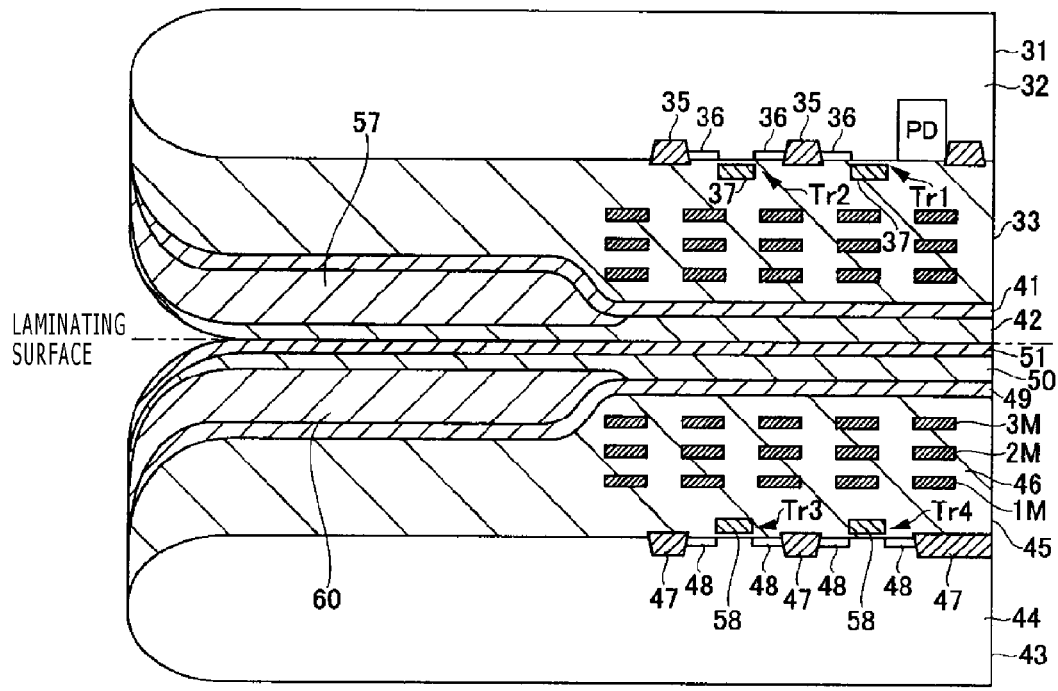

Next, as shown in FIG. 4H, the surface over the wiring layer 33 formed in the first semiconductor wafer 31 and the surface on the side of the wiring layer 45 formed in the second semiconductor wafer 43 are opposed to each other as laminating surfaces. A part of the surface of one of the first semiconductor wafer 31 and the second semiconductor wafer 43 is thereafter pressed by a pin. Then, the whole surfaces of the first semiconductor wafer 31 and the second semiconductor wafer 43 are bonded to each other by a Van der Waals force between the first semiconductor wafer 31 and the second semiconductor wafer 43. A heat treatment at about 400° C. is thereafter performed for about 60 minutes under an atmosphere of nitrogen at atmospheric pressure. Thereby, the silanol group in the surface on the side of the wiring layer 33 formed in the first semiconductor wafer 31 and the silanol group in the surface on the side of the wiring layer 45 formed in the second semiconductor wafer 43 are dehydration-condensed with each other, and bonding at a molecular level is completed.

In the example of the present embodiment, the surfaces on the sides of the wiring layers 33 and 45 in the first semiconductor wafer 31 and the second semiconductor wafer 43 are each made flat as far as the peripheral regions of the wafers. Thus, the first semiconductor wafer 31 and the second semiconductor wafer 43 are bonded to each other also in the peripheral regions, so that bonding strength is improved.

Figure 4I:
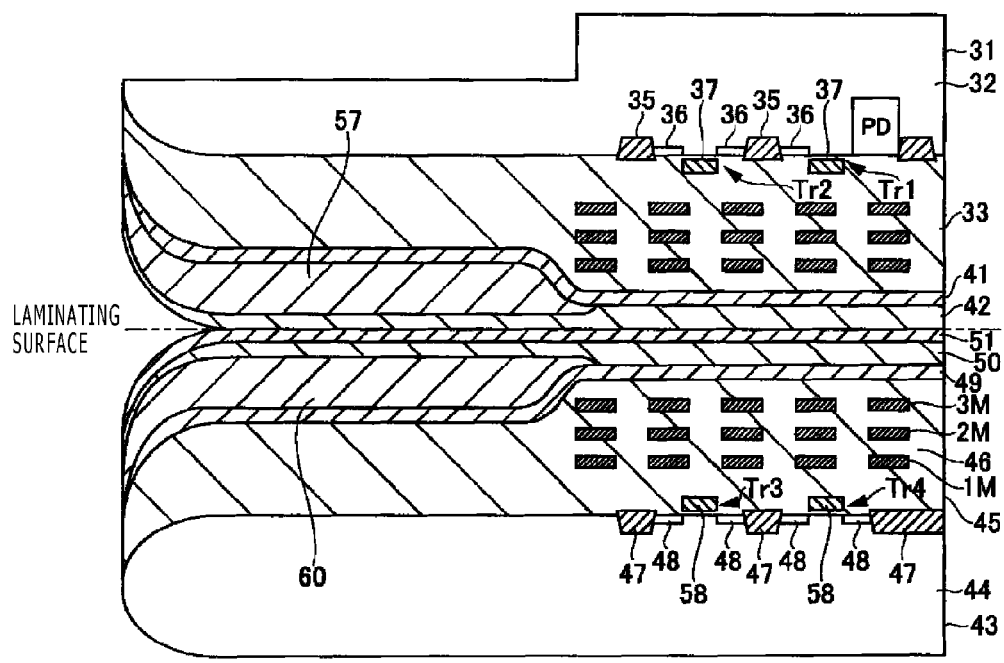

After the completion of the bonding, as shown in FIG. 4I, the peripheral region 53 of the first semiconductor wafer 31 is polished from a back side to be reduced in thickness. In the example of the present embodiment, the first semiconductor wafer 31 and the second semiconductor wafer 43 are bonded in close contact with each other also in the peripheral region 53 of the wafer, so that high bonding strength is obtained. It is therefore possible to prevent film peeling, chipping, and the like between the first semiconductor wafer 31 and the second semiconductor wafer 43 at the time of polishing.

Figure 4J:
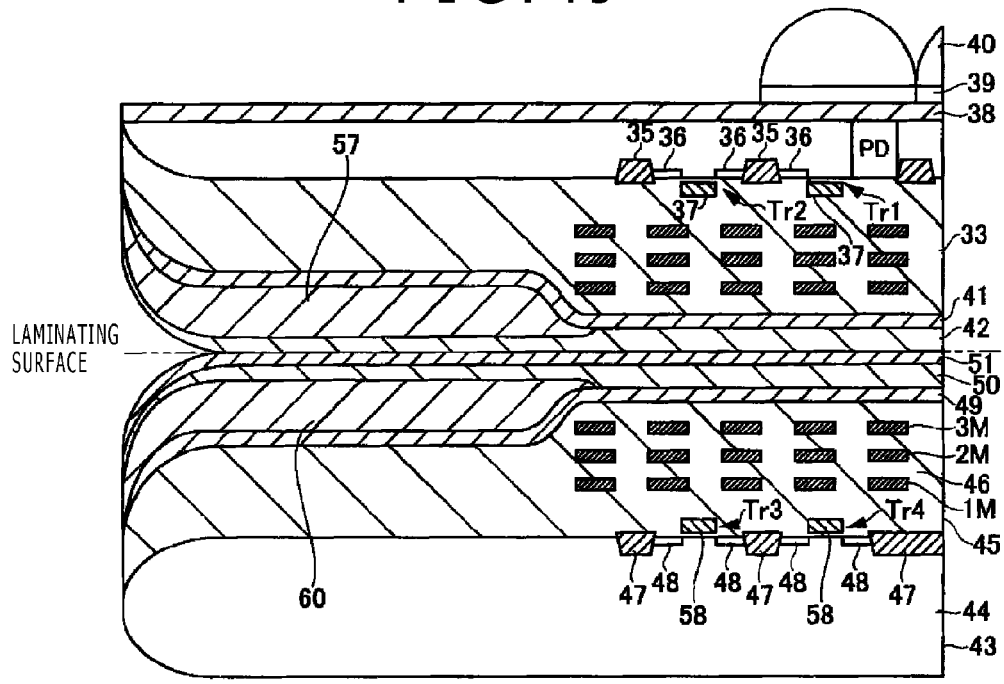

Thereafter, as shown in FIG. 4J, the first semiconductor wafer 31 is polished from the back side, whereby the whole of the first semiconductor wafer 31 is reduced in thickness. At this time, the first semiconductor wafer 31 is reduced in thickness to such a degree that the photodiode (PD) in the pixel region 56 is not exposed to the back side. Also in this thickness reducing process, as in the previous process, the first semiconductor wafer 31 and the second semiconductor wafer 43 are bonded to each other throughout the entire surfaces of the first semiconductor wafer 31 and the second semiconductor wafer 43. Thus, as in the previous stage, peeling between the wafers and the chipping of the wafers are prevented.

Thereafter, a planarizing film 38 is formed on the back side of the first semiconductor wafer 31, a desired color filter layer 39 is formed on a pixel-by-pixel basis on the planarizing film 38 in the pixel region 56, and an on-chip lens 40 is formed on the color filter layer 39. The planarizing film 38, the color filter layer 39, and the on-chip lens 40 can be formed by a similar method to that of a solid-state imaging device in the past.

Then, though not shown, the example of the present embodiment has a process for electrically connecting the pixel region 56 and the control region 55 formed in the first semiconductor wafer 31 to the logic circuit 59 formed in the second semiconductor wafer 43 after reducing the thickness of the first semiconductor wafer 31. In this case, for example a through hole penetrating the first semiconductor wafer 31 and reaching the wiring layer 33 formed in the first semiconductor wafer 31 and a through hole reaching the wiring layer 45 formed in the surface of the second semiconductor wafer 43 are formed. A connecting conductor is thereafter embedded in the through holes, whereby the wiring layer 33 formed in the first semiconductor wafer 31 and the wiring layer 45 formed in the second semiconductor wafer 43 are electrically connected to each other on the back side of the first semiconductor wafer 31. Thereby, the pixel region 56 and the control region 55 formed in the first semiconductor wafer 31 can be electrically connected to the logic circuit 59 formed in the second semiconductor wafer 43.

In addition, an opening for exposing an electrode pad formed in a part of the wiring 1M to 3M of the wiring layer 45 formed in the second semiconductor wafer 43 is formed from the back side of the first semiconductor wafer 31, and a bonding wire is connected to the electrode pad. Thereby, the wiring 1M to 3M of the wiring layer 45 formed in the second semiconductor wafer 43 can be electrically drawn out to the back side of the first semiconductor wafer 31. In the example of the present embodiment, the whole surfaces of the first semiconductor wafer 31 and the second semiconductor wafer 43 are bonded to each other also when the through holes and the opening are formed, so that damage to the wafers in the hole making process can be reduced.

Figure 4K:
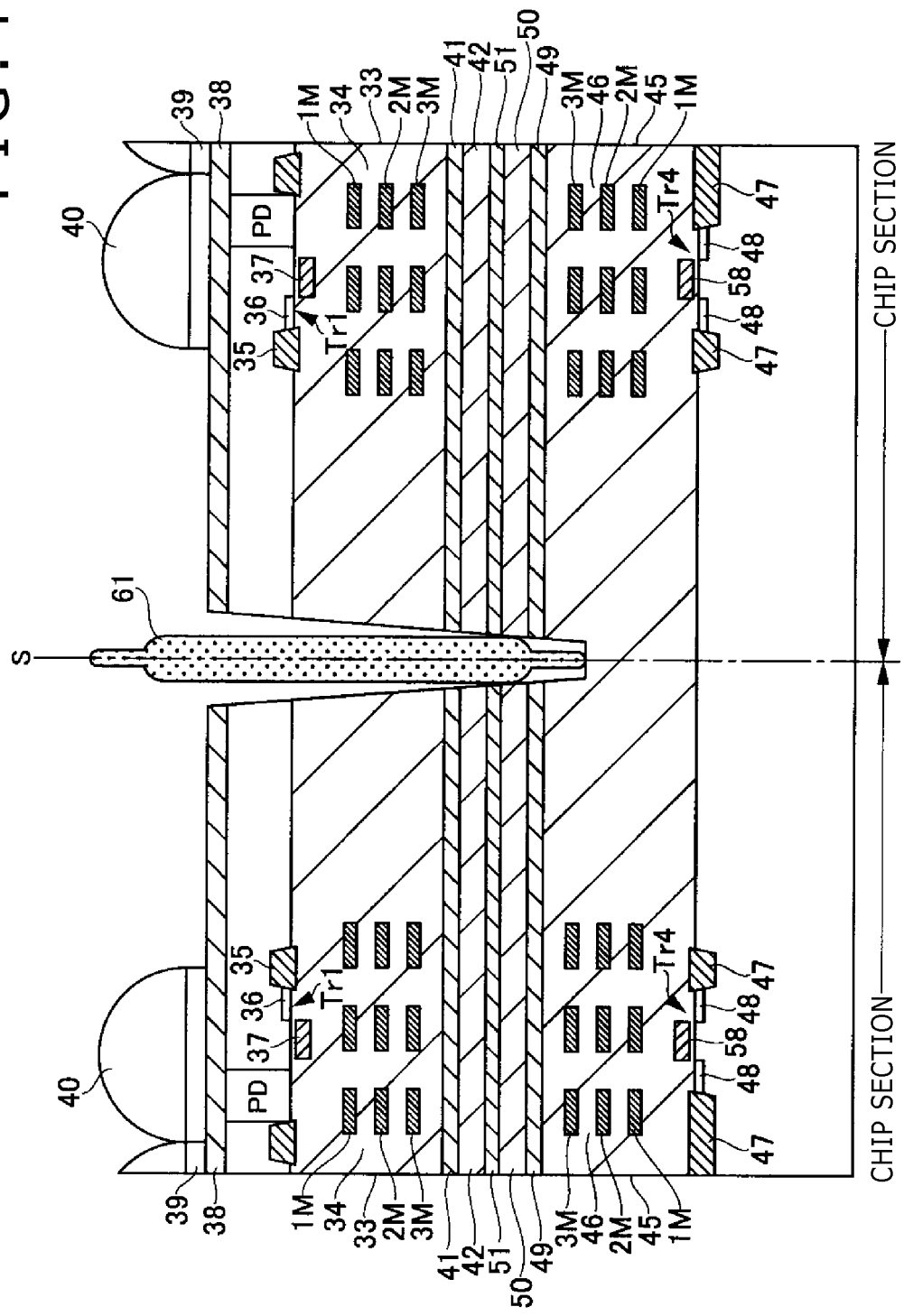

After the on-chip lens 40 is formed, as shown in FIG. 4K, the wafers are cut by a dicing cutter 61 along a scribe line S for separating each chip section. Thereby, each chip section is separated, and the backside illumination type solid-state imaging device 30 shown in FIG. 3 is completed. Incidentally, though not shown, the peripheral regions are also cut by the dicing cutter and removed.

In the example of the present embodiment, in each of the first semiconductor wafer 31 and the second semiconductor wafer 43, the level difference of the upper part of the wiring layer which level difference is formed at the boundary between the peripheral region and the inside region is eliminated by forming a buried film. Thus, lamination with the upper parts of the wiring layers as laminating surfaces is performed in an excellent manner also in the peripheral regions of the semiconductor wafers, so that the adhesion and contact properties of the first semiconductor wafer 31 and the second semiconductor wafer 43 can be improved. Thereby, peeling of a laminating surface, chipping in a peripheral region, and the like are prevented in a polishing process after lamination and a dicing process, for example, so that reliability at the time of processing is improved. It is thereby possible to obtain a solid-state imaging device with high precision, and improve a yield.

<2. Second Embodiment: Solid-State Imaging Device>

Figure 5:
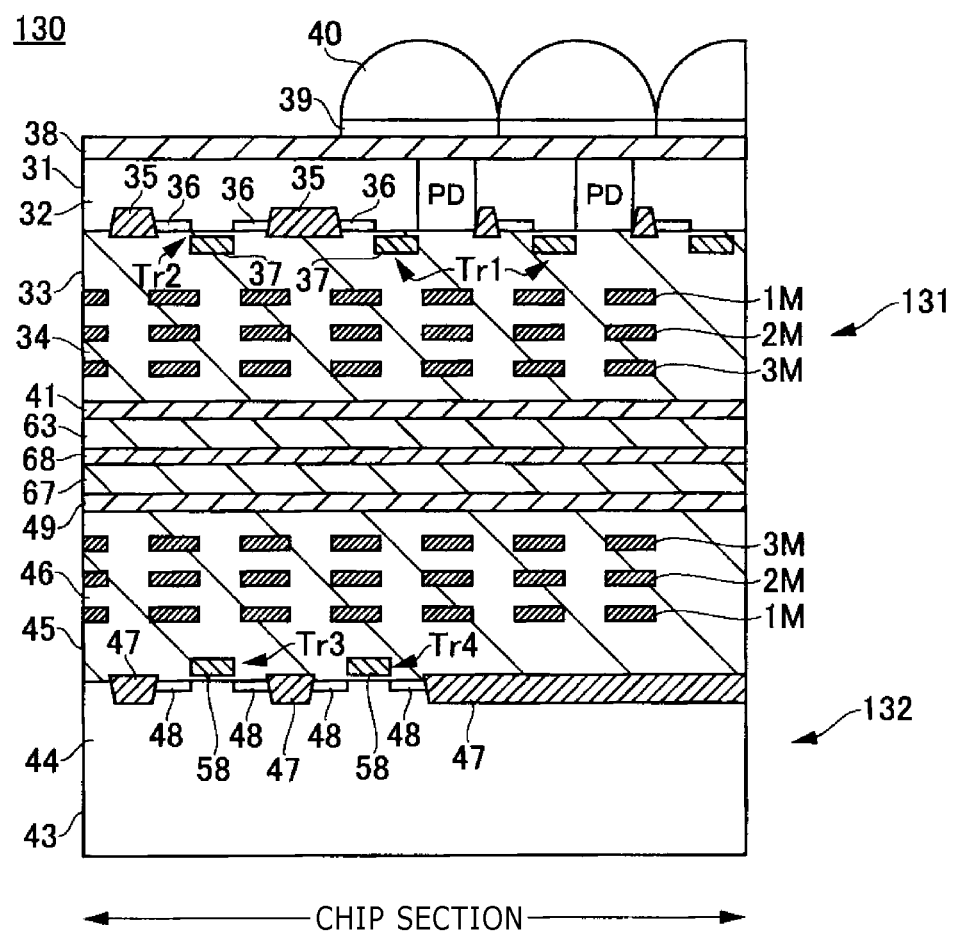
FIG. 5 is a sectional view of a constitution of a solid-state imaging device according to a second embodiment of the present technology.

A backside illumination type solid-state imaging device as a semiconductor device according to a second embodiment of the present technology will next be described together with a method for manufacturing the solid-state imaging device with reference to FIG. 5 and FIGS. 6A to 6F. In FIGS. 5 to 6F, parts corresponding to those of FIGS. 3 to 4K are identified by the same reference numerals, and repeated description thereof will be omitted.

FIG. 5 is a schematic sectional structural view of the solid-state imaging device 130 according to an example of the present embodiment when the solid-state imaging device 130 is completed after wafers are divided into each chip. The solid-state imaging device 130 according to the example of the present embodiment has a first semiconductor chip section 131 including a pixel region and a control region and a second semiconductor chip section 132 including a logic circuit, the first semiconductor chip section 131 and the second semiconductor chip section 132 being vertically laminated to each other and bonded to each other by plasma bonding. The solid-state imaging device 130 according to the example of the present embodiment is an example different from the solid-state imaging device 30 according to the first embodiment in terms of a constitution of a buried layer.

FIGS. 6A to 6F are manufacturing process diagrams of the solid-state imaging device 130 according to the example of the present embodiment. As in the first embodiment, FIGS. 6A to 6F show a section of a region including a boundary part between a peripheral region of a semiconductor wafer and an inside region in which a photoelectric conversion section forming a pixel as well as transistors and the like forming a circuit is formed.

First, as in the process of FIG. 4A and FIG. 4B in the example of the first embodiment, a pixel region 56 and a control region 55 are formed in a first semiconductor wafer 31, a wiring layer 33 is formed on the surface of the first semiconductor wafer 31, and a passivation film 41 is formed on the surface of the wiring layer 33. Also in the example of the present embodiment, a level difference is formed at a boundary between the peripheral region 53 and the inside region 54 of the first semiconductor wafer 31 for similar reasons to those of the first embodiment.

Figure 6A:
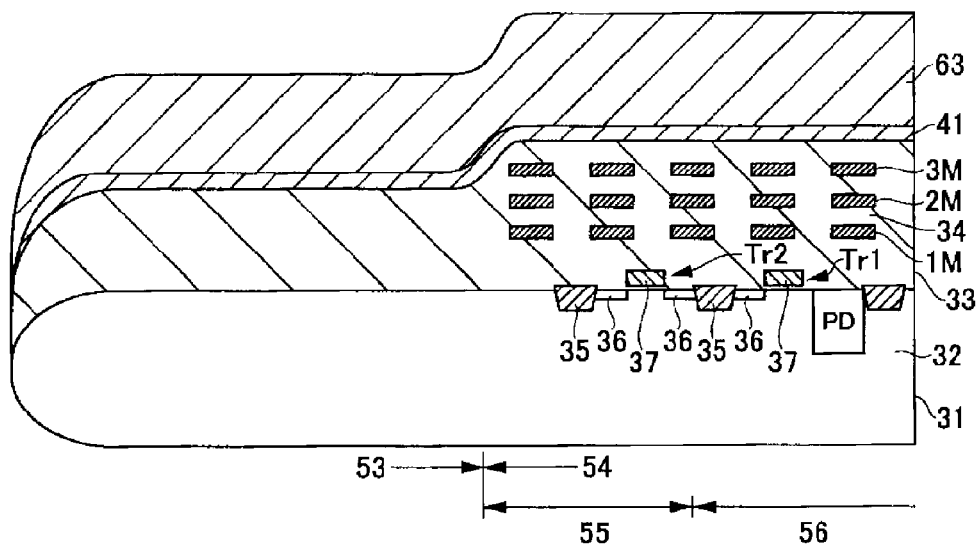
FIGS. 6A to 6F are process diagrams of a method for manufacturing the solid-state imaging device according to the second embodiment of the present technology.
Figure 6B:
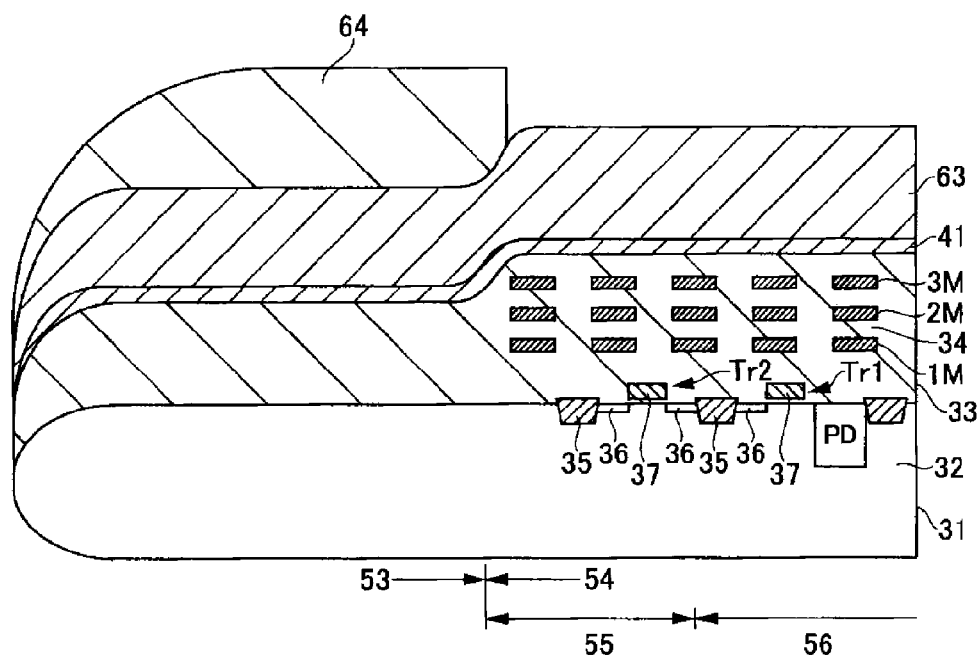

Next, as shown in FIG. 6B, a buried film 63 made of a P—$SiO_2$ film having a film thickness equal to or more than the level difference between the peripheral region 53 and the inside region 54 is formed on the passivation film 41 by using a plasma CVD method. In this stage, although the thickness of the buried film 63 is equal to or more than the level difference between the peripheral region 53 and the inside region 54, the level difference between the peripheral region 53 and the inside region 54 is not eliminated because the buried film 63 is formed in a conformal manner along the shape of the surface of the passivation film 41. Thereafter, as shown in FIG. 6B, a resist mask 64 having an opening over the inside region 54 is formed on the buried film 63 by using a photolithography process.

Figure 6C:
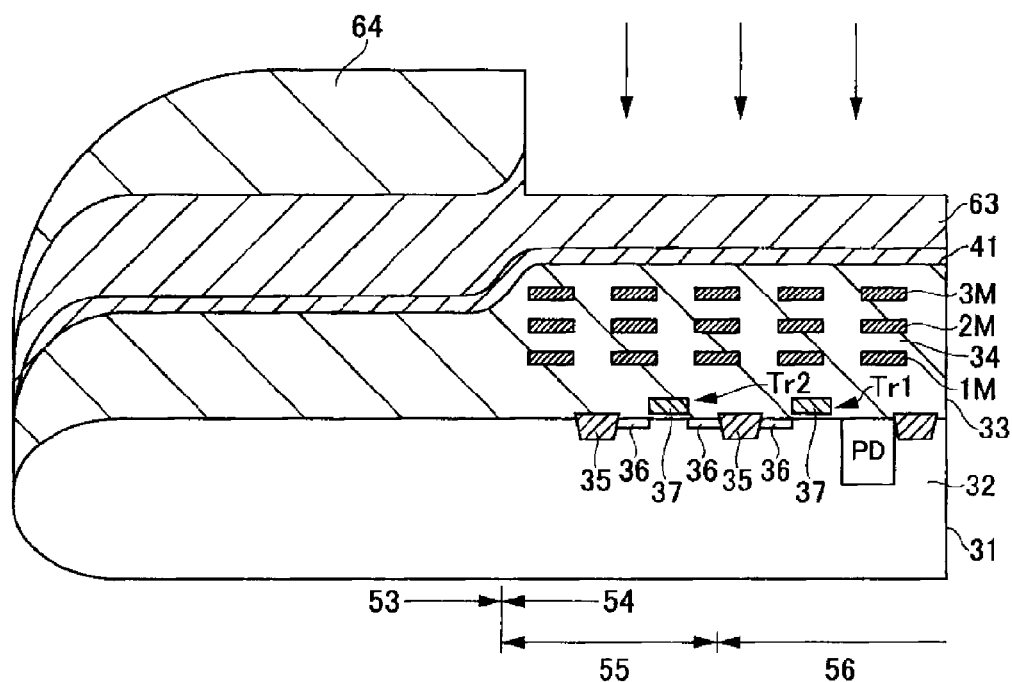

Next, as shown in FIG. 6C, using dry etching via the resist mask 64, the buried film 63 formed in the inside region 54 is etched back until the surface of the buried film 63 formed in the inside region 54 has substantially the same height as the surface of the buried film 63 formed in the peripheral region 53. Thereafter the resist mask 64 is removed. Thereby, the large level difference caused by empty grooves which level difference is formed at the boundary between the peripheral region 53 and the inside region 54 of the first semiconductor wafer 31 is substantially eliminated.

Figure 6D:
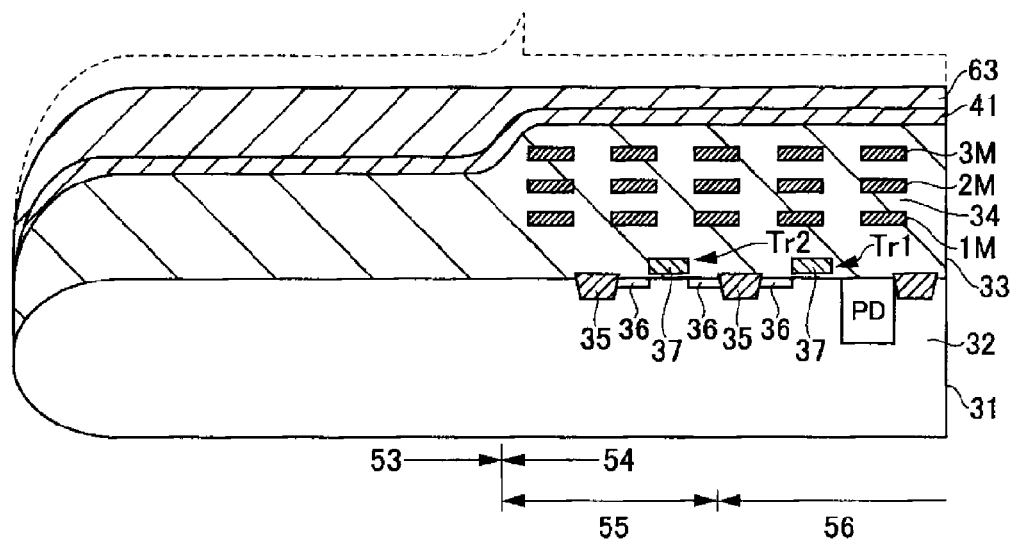

Next, as shown in FIG. 6D, the surface of the buried film 63 of the first semiconductor wafer 31 is polished and planarized using a CMP method. Thereby, the whole surface over the wiring layer 33 formed in the first semiconductor wafer 31 are made flat. While the surface of the buried film 63 is planarized by a CMP method in the example of the present embodiment, one layer of polishable film to be polished may be formed on the buried film 63 and thereafter planarized by using a CMP method, as in the first embodiment.

In the processes thus far, the pixel region 56 and the control region 55 are formed on the first semiconductor wafer 31, and the wiring layer 33 is formed on the surface side of the first semiconductor wafer 31.

Figure 6E:
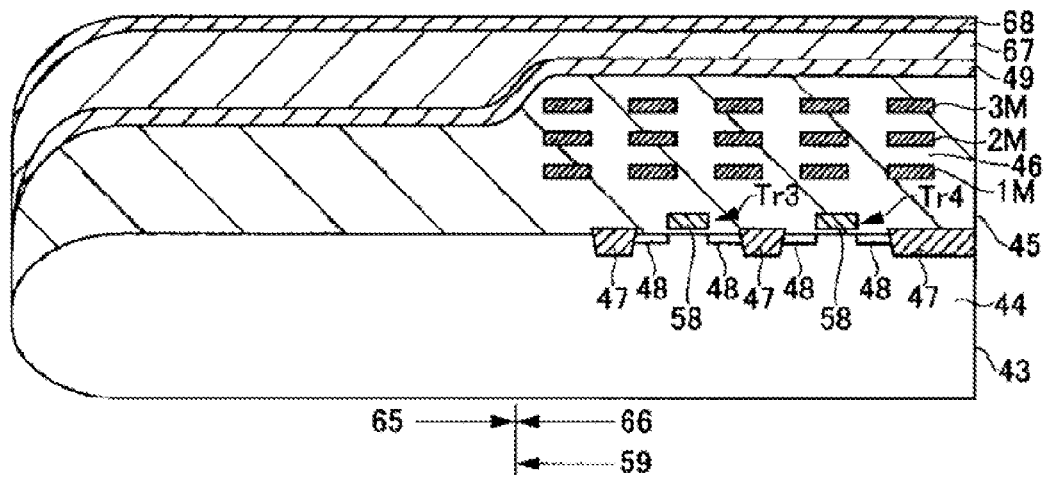
Figure 6F:
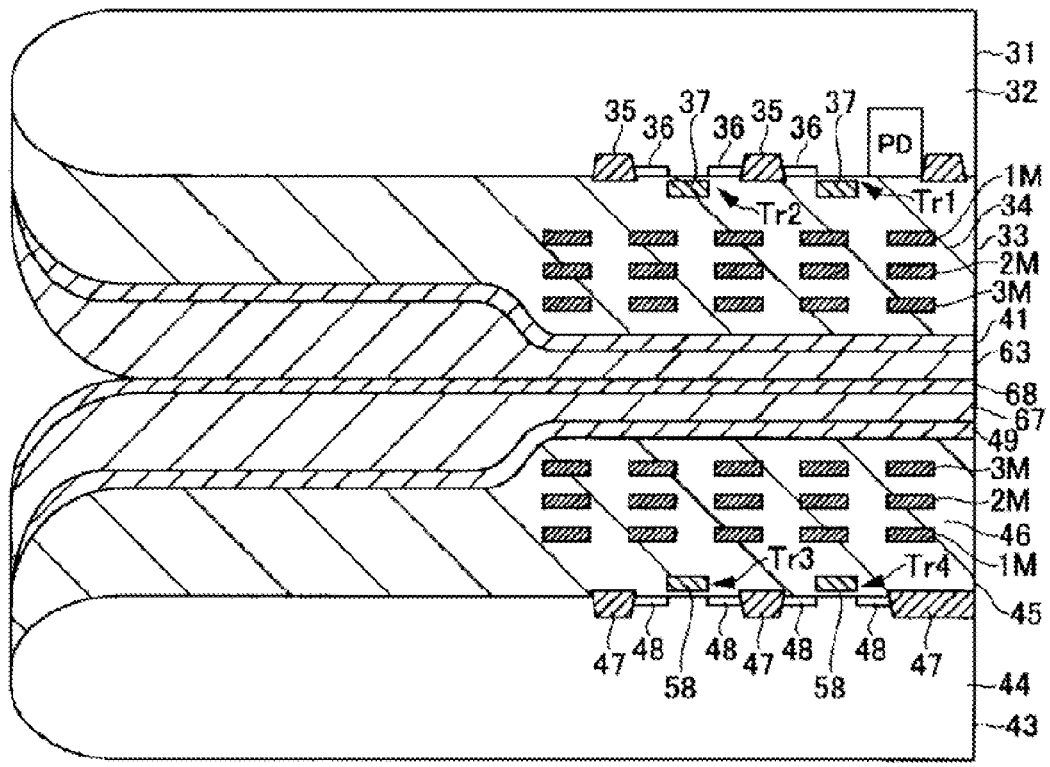

Meanwhile, as shown in FIG. 6E, a logic circuit 59 including a signal processing circuit for processing a signal obtained from a pixel is formed in an inside region 66 forming each chip section in a second semiconductor wafer 43 made of silicon, for example. Thereafter, a wiring layer 45 and a passivation film 49 are formed as in the first embodiment, and a buried film 67 having a planarized surface is formed as in FIGS. 6A to 6D in the example of the present embodiment. Thereby, also in the second semiconductor wafer 43, a large level difference formed at a boundary between the peripheral region 65 and the inside region 66 is eliminated, and a surface over the wiring layer 45 is planarized. Thereafter, a bonding aid film 68 is formed on the buried film 67 by a method similar to that of the first embodiment.

Then, the surface over the wiring layer 33 formed in the first semiconductor wafer 31 and the surface over the wiring layer 45 formed in the second semiconductor wafer 43 are irradiated with oxygen plasma for 60 seconds at a frequency of 13.56 MHz, a pressure of 10 Pa, and a power of 100 W, for example, so that the surfaces are modified. Thereafter, the surfaces are cleaned for 30 seconds with a pure water with 18 MΩ or more, whereby a silanol group (Si—OH group) is formed in the surface over the wiring layer 33 formed in the first semiconductor wafer 31 and the surface over the wiring layer 45 formed in the second semiconductor wafer 43.

Next, as shown in FIG. 6F, the surface over the wiring layer 33 formed in the first semiconductor wafer 31 and the surface over the wiring layer 45 formed in the second semiconductor wafer 43 are opposed to each other. A part of the surface of one of the first semiconductor wafer 31 and the second semiconductor wafer 43 is thereafter pressed by a pin. Then, the whole surfaces of the first semiconductor wafer 31 and the second semiconductor wafer 43 are bonded to each other by a Van der Waals force between the first semiconductor wafer 31 and the second semiconductor wafer 43. A heat treatment at about 400° C. is thereafter performed for about 60 minutes under an atmosphere of nitrogen at atmospheric pressure. Thereby, the silanol group in the surface over the wiring layer 33 formed in the first semiconductor wafer 31 and the silanol group in the surface over the wiring layer 45 formed in the second semiconductor wafer 43 are dehydration-condensed with each other, and bonding at a molecular level is completed.

Thereafter, the solid-state imaging device 130 shown in FIG. 5 can be obtained as in the processes shown in FIGS. 4I to 4K in the first embodiment.

Also in the example of the present embodiment, the level differences formed at the boundaries between the peripheral regions and the inside regions of the semiconductor wafers are eliminated by buried films, and therefore effects similar to those of the first embodiment can be obtained.

<3. Third Embodiment: Solid-State Imaging Device>

Figure 7:
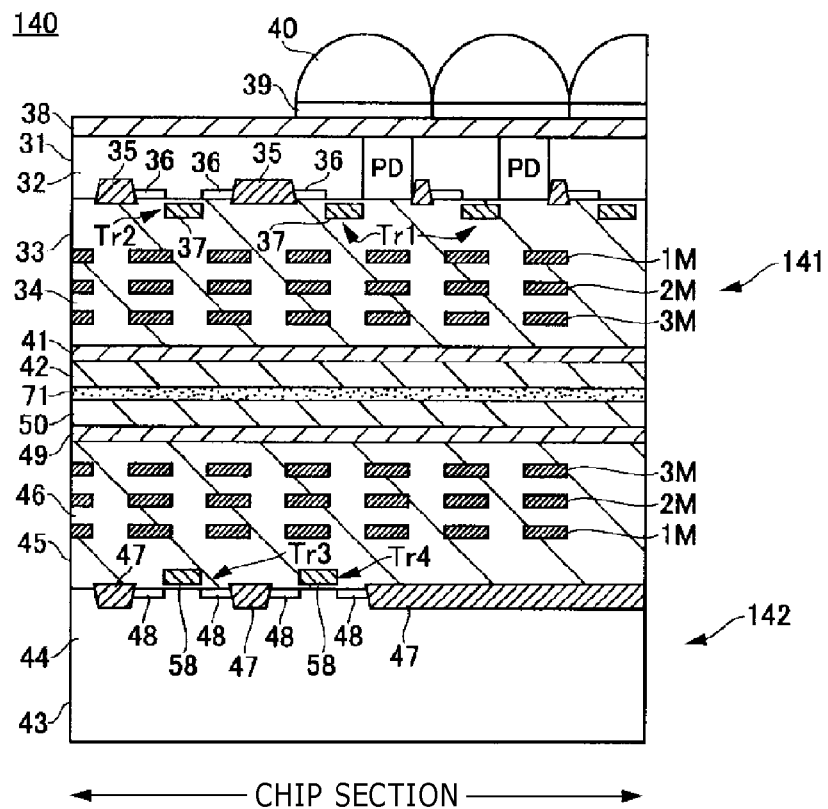
FIG. 7 is a sectional view of a constitution of a solid-state imaging device according to a third embodiment of the present technology.
Figure 8:
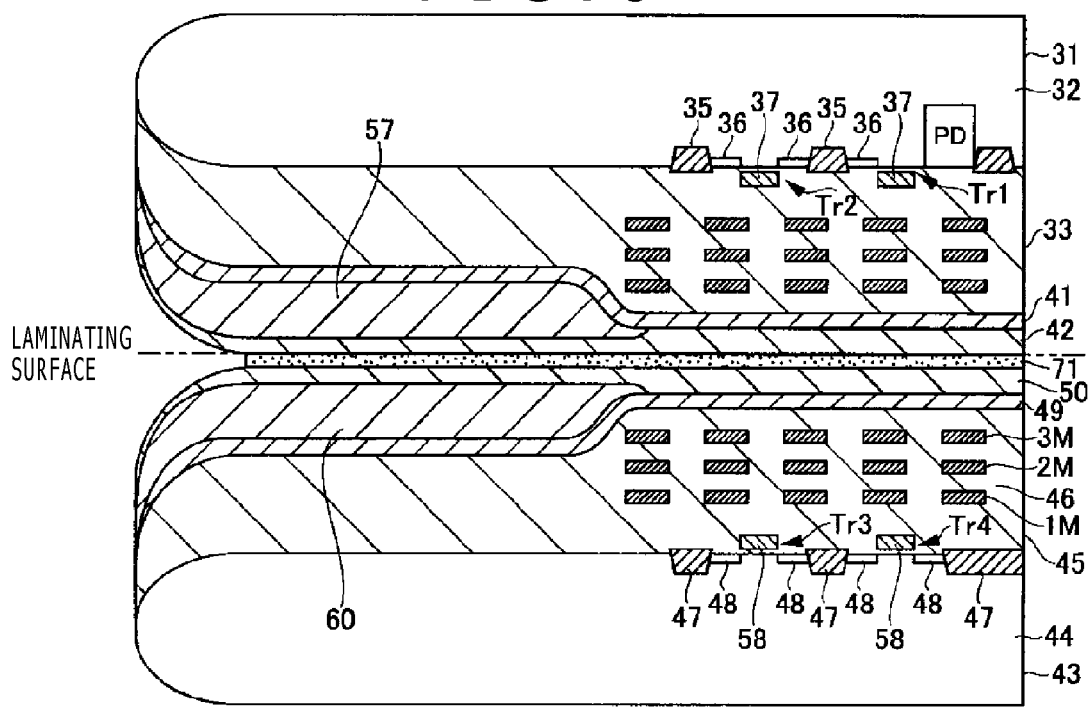
FIG. 8 is a process diagram of a method for manufacturing the solid-state imaging device according to the third embodiment of the present technology.

A backside illumination type solid-state imaging device as a semiconductor device according to a third embodiment of the present technology will next be described together with a method for manufacturing the solid-state imaging device with reference to FIG. 7 and FIG. 8. In FIG. 7 and FIG. 8, parts corresponding to those of FIGS. 3 to 4K are identified by the same reference numerals, and repeated description thereof will be omitted.

FIG. 7 is a schematic sectional structural view of a solid-state imaging device 140 according to an example of the present embodiment when the solid-state imaging device 140 is completed after wafers are divided into each chip. The solid-state imaging device 140 according to the example of the present embodiment has a first semiconductor chip section 141 including a pixel region and a control region and a second semiconductor chip section 142 including a logic circuit, the first semiconductor chip section 141 and the second semiconductor chip section 142 being vertically laminated to each other and bonded to each other via an adhesive layer 71. The solid-state imaging device 140 according to the example of the present embodiment is an example different from the solid-state imaging device 30 according to the first embodiment in terms of a method for connection between wafers (chips).

In the example of the present embodiment, as shown in FIG. 8, a first semiconductor wafer 31 planarized by a buried film 57 and a second semiconductor wafer 43 planarized by a buried film 60 are laminated to each other via the adhesive layer 71 such that surfaces over wiring layers 33 and 45 face each other. The constitution of the wiring layer 33, the buried film 57, and the like formed on the first semiconductor wafer 31 is similar to that of the first embodiment, and is formed in the processes of FIGS. 4A to 4E. In addition, the constitution of the wiring layer 45, the buried film 60, and the like on the second semiconductor wafer 43 is similar to that of the first embodiment. However, no bonding aid film is formed but the adhesive layer 71 having a desired thickness is formed over the buried film 60 in the second semiconductor wafer 43. A thermosetting adhesive material can be used as the adhesive layer 71. In addition, BCB (benzocyclobutene), polyimide, or polybenzoxazole can be used. While the adhesive layer 71 is formed on the side of the second semiconductor wafer 43 in the example of the present embodiment, the adhesive layer 71 may be formed on the side of the first semiconductor wafer 31 in another example, or the adhesive layer 71 may be formed on both of the wafers.

Also in the example of the present embodiment, the surfaces over the wiring layers are planarized by the buried films in the first semiconductor wafer 31 and the second semiconductor wafer 43. Therefore, bonding and contact properties can be improved also in the case where the first semiconductor wafer 31 and the second semiconductor wafer 43 are bonded to each other via the adhesive layer 71. In addition, thermosetting type adhesive materials generally have high hardness, and therefore do not easily fill in a level difference when the level difference is large. Thus when laminating surfaces are planarized as in the example of the present embodiment, a thermosetting type adhesive material can be used.

Also in the example of the present embodiment, after the first semiconductor wafer 31 and the second semiconductor wafer 43 are laminated to each other, the first semiconductor wafer 31 and the second semiconductor wafer 43 are divided into each chip section as in FIGS. 4I to 4K, and then the solid-state imaging device 140 shown in FIG. 7 is completed.

Also in the method for manufacturing the solid-state imaging device 140 according to the example of the present embodiment, the first semiconductor wafer 31 and the second semiconductor wafer 43 can be bonded in close contact with each other as far as the peripheral regions at the time of lamination of the first semiconductor wafer 31 and the second semiconductor wafer 43. It is therefore possible to prevent peeling, chipping, and the like in a process of reducing the thickness of the wafers. Other similar effects to those of the first embodiment can be obtained.

It is to be noted that the present technology is not limited to application to solid-state imaging devices for sensing a distribution of amounts of incident visible light and imaging the distribution as an image, but is also applicable to solid-state imaging devices for imaging a distribution of amounts of incidence of infrared rays, X-rays, particles, or the like as an image. In addition, in a broad sense, the present technology is applicable to solid-state imaging devices (physical quantity distribution sensing devices) in general such as fingerprint detecting sensors and the like for sensing a distribution of another physical quantity such as pressure, capacitance, or the like, and imaging the distribution as an image.

Further, the present technology is not limited to solid-state imaging devices that scan each unit pixel of a pixel section in order in row units and which read a pixel signal from each unit pixel. The present technology is also applicable to X-Y address type solid-state imaging devices that select an arbitrary pixel in a pixel unit, and which read a signal from the selected pixel in a pixel unit.

Incidentally, the solid-state imaging devices may be formed as one chip, or may be in the form of a module having an imaging function in which module a pixel section and a signal processing section or an optical system are packaged collectively.

In addition, the present technology is not limited to application to solid-state imaging devices, but is also applicable to other than imaging devices. The imaging devices in this case refer to camera systems such as digital still cameras, video cameras, and the like and electronic devices having an imaging function such as portable telephones and the like. Incidentally, the form of the above-described module included in an electronic device, that is, a camera module may be referred to as an imaging device.

In addition, in the above-described embodiments, description has been made of a method for manufacturing a backside illumination type solid-state imaging device by laminating a first semiconductor wafer 31 having pixels formed therein and a second semiconductor wafer 43 having a logic circuit formed therein to each other. However, the present technology is not limited to this. The present technology is also applicable to semiconductor devices in which no pixel region is formed. Description in the following will be made of an example in which the present technology is applied to a semiconductor device.

<4. Fourth Embodiment: Semiconductor Device>

A semiconductor device 150 according to a fourth embodiment of the present technology will be described together with a method for manufacturing the semiconductor device with reference to FIG. 9 and FIGS. 10A to 10G. The semiconductor device 150 according to an example of the present embodiment has a first semiconductor integrated circuit and a second semiconductor integrated circuit mixed therein.

Figure 10A:
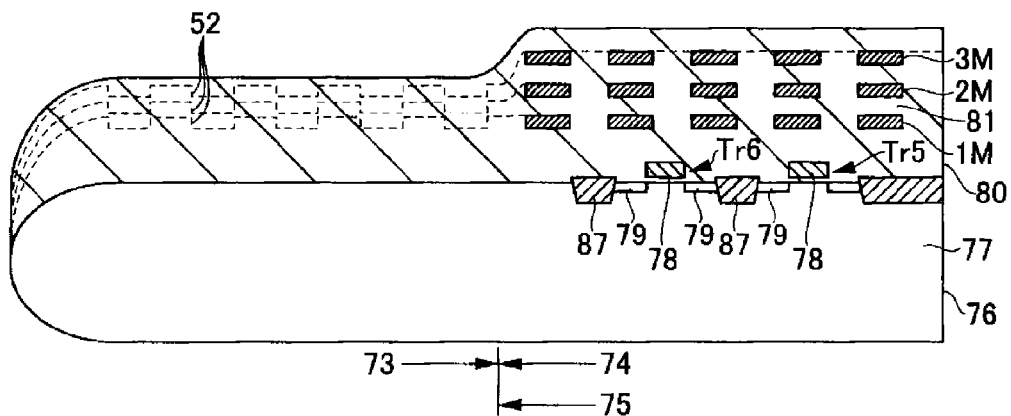
FIGS. 10A to 10G are process diagrams of a method for manufacturing the solid-state imaging device according to the fourth embodiment of the present technology.

In the example of the present embodiment, first, as shown in FIG. 10A, a first semiconductor integrated circuit 75, or a logic circuit in the example of the present embodiment, is formed in an inside region 74 forming each chip section of a first semiconductor wafer 76 made of a silicon substrate. Specifically, a plurality of MOS transistors Tr5 and Tr6 are formed in the region forming each chip section in a semiconductor well region 77 formed in the first semiconductor wafer 76. Each of the MOS transistors Tr5 and Tr6 includes a pair of source/drain regions 79 and a gate electrode 78 formed on a gate insulating film. The MOS transistors Tr5 and Tr6 are isolated from each other by an element isolation region 87.

In FIG. 10A, the MOS transistors forming the logic circuit are represented by the MOS transistors Tr5 and Tr6. However, the logic circuit can be formed by a CMOS transistor. Thus, the plurality of MOS transistors can be formed as an n-channel MOS transistor or a p-channel MOS transistor. Hence, when an n-channel MOS transistor is formed, n-type source/drain regions are formed in a p-type semiconductor well region. When a p-channel MOS transistor is formed, p-type source/drain regions are formed in an n-type semiconductor well region.

Incidentally, the first semiconductor integrated circuit 75 can be for example a semiconductor memory circuit in place of the logic circuit. In this case, a logic circuit as a second semiconductor integrated circuit 102 to be described later is used for processing the signal of the semiconductor memory circuit.

Next, a wiring layer 80 having a plurality of layers (three layers in FIG. 10A) of wiring 1M to 3M formed therein is formed on the surface of the first semiconductor wafer 76 by alternately repeating the formation of an interlayer insulating film 81 and the formation of the wiring 1M to 3M made of Cu. The formation of the wiring 1M to 3M made of Cu is similar to the formation of the wiring layer in the past as described with reference to FIGS. 12A to 12G. The wiring 1M to 3M made of Cu is formed by embedding a wiring material made of Cu in groove parts pattern-formed on the interlayer insulating films 81. In addition, though not shown in FIG. 10A, a contact part electrically connected to the transistors Tr5 and Tr6 formed in the first semiconductor wafer 76 and a contact part for establishing connection between desired pieces of wiring are formed. When the contact parts are formed, contact holes are formed in desired positions of the interlayer insulating films 81, and a conductive material is embedded in the contact holes.

In the example of the present embodiment, in a stage of formation of the wiring layer 80, the wiring 1M to 3M other than the theoretical yield which wiring is formed in the peripheral region 73 is removed by using the EBR method each time each layer of wiring 1M to 3M is formed in order to prevent exposure of Cu as a wiring material from the periphery of the first semiconductor wafer 76. Thereby, in the peripheral region 73, empty grooves 52 are formed each time the wiring 1M to 3M is removed, the surface of the wiring layer 80 in the peripheral region 73 is depressed due to the empty grooves 52, and a level difference occurs in a boundary part between the peripheral region 73 and the inside region 74 as a region on the inside of the peripheral region 73.

Figure 10B:
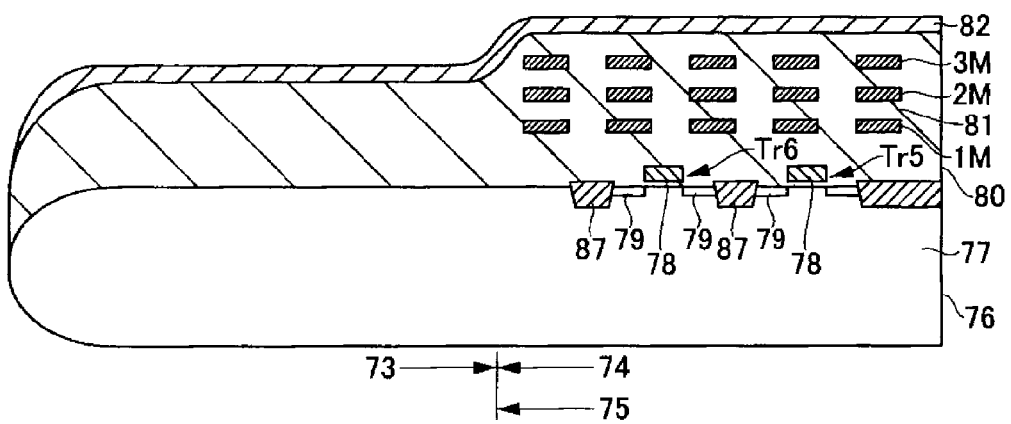

Next, as shown in FIG. 10B, a passivation film 82 (protective film) is formed on the surface of the wiring layer 80. This passivation film 82 protects the wiring 1M to 3M, and reduces small projections and depressions formed in the surface of the wiring layer 80 in the inside region 74 in which the wiring 1M to 3M is formed. However, the passivation film 82 is formed along the shape of the surface because of the large level difference at the boundary between the peripheral region 73 and the inside region 74. Therefore the global level difference at the boundary part between the peripheral region 73 and the inside region 74 remains as a result of the formation of the passivation film 82.

Figure 10C:
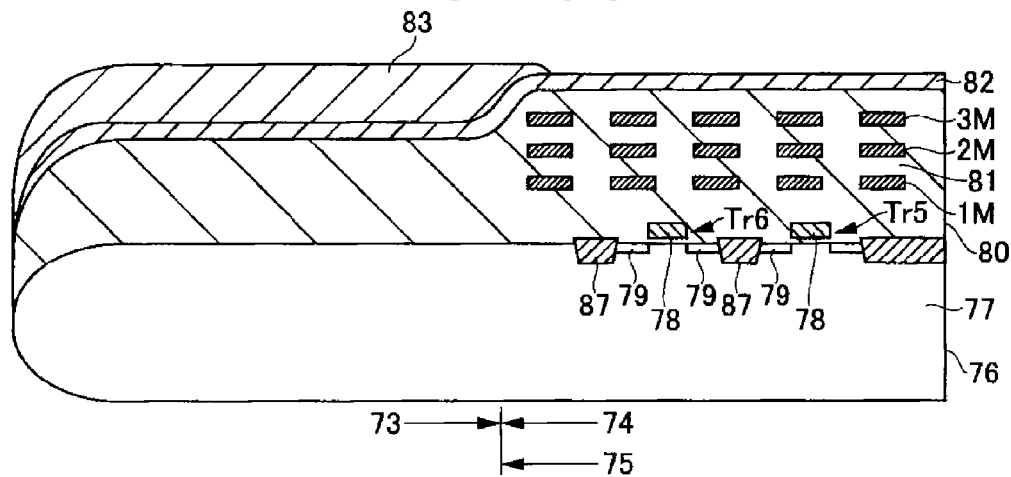

Next, as shown in FIG. 10C, a buried film 83 for filling the level difference formed at the boundary between the peripheral region 73 and the inside region 74 is formed by locally applying a coating material to the upper part of the passivation film 82 only in the peripheral region 73 of the first semiconductor wafer 76. The buried film 83 is formed by applying the coating material until the surface of the buried film 83 has substantially the same height as the surface of the passivation film 82 in the inside region 74. For example, SOG, SOD, or a low-k material can be used as the coating material. Thus forming the buried film 83 locally in the peripheral region 73 of the first semiconductor wafer 76 eases the global level difference due to the wiring pattern formed on the surface side of the first semiconductor wafer 76.

Figure 10D:
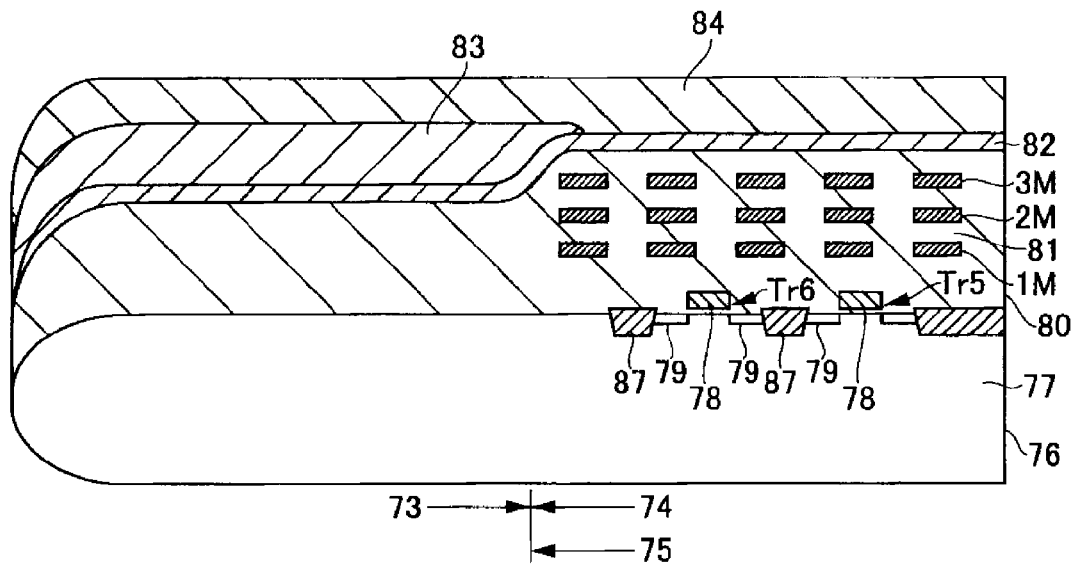

Next, as shown in FIG. 10D, a film 84 to be polished which film is made of a P—SiO$_2$ film is formed on the entire surface of the first semiconductor wafer 76 which entire surface includes the passivation film 82 and the buried film 83, using a plasma CVD method. The film 84 to be polished is to be polished in a next process. In the example of the present embodiment, the P—SiO$_2$ film is formed as the film 84 to be polished. In the example of the present embodiment, the film 84 to be polished is formed by the plasma CVD method. However, the method for forming the film 84 is not particularly limited even when the film 84 to be polished is a thin film formed by a thermal CVD method, a sputtering method, an evaporation method, an ALD (Atomic Layer Deposition) method, or the like as long as the thin film is a kind of polishable film. In addition, while a P—SiO$_2$ film is formed in the present example, it suffices for the film to be a polishable film. In addition to the SiO$_2$ film, TEOS, SiN, SiCOH, SiCN, SiC, BPSG, PSG, or the like can be used. Further, while the film 84 to be polished is formed in the example of the present embodiment, the film 84 to be polished does not necessarily need to be formed. It may be possible to proceed to the next process without forming the film 84 to be polished.

Figure 10E:
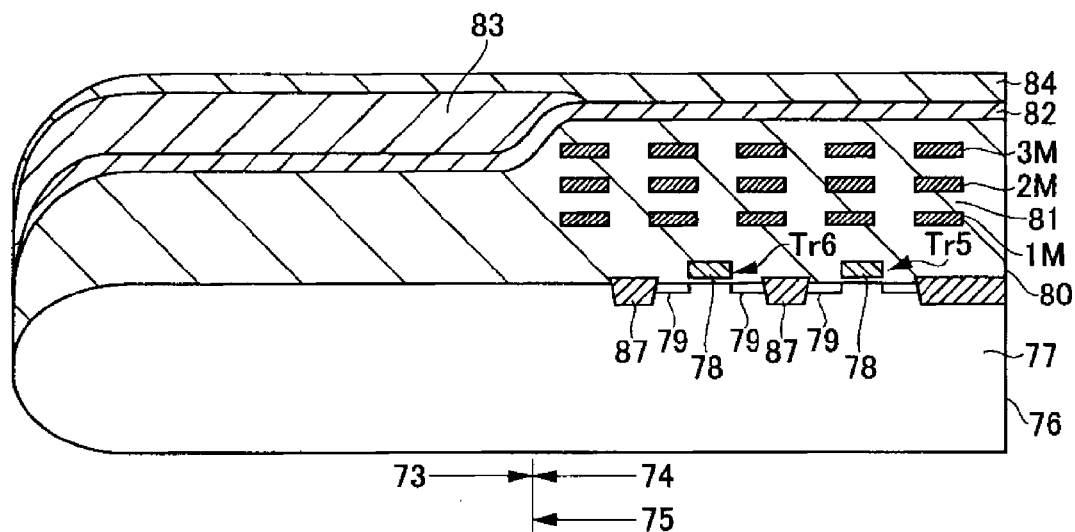

Then, as shown in FIG. 10E, the surface of the film 84 to be polished is polished and planarized by using a CMP method. The entire surface over the wiring layer 80 formed in the first semiconductor wafer 76 is thereby planarized.

In the processes thus far, the first semiconductor integrated circuit 75 is formed in the first semiconductor wafer 76, and the wiring layer 80 is formed on the surface side of the first semiconductor wafer 76.

Figure 10F:
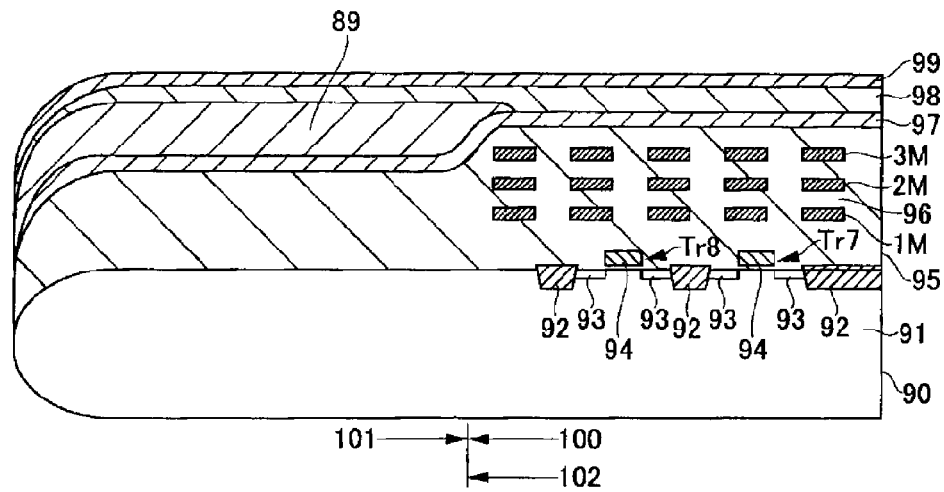

Meanwhile, as shown in FIG. 10F, a second semiconductor integrated circuit 102, or a logic circuit in the example of the present embodiment, is formed in a region forming each chip section in a second semiconductor wafer 90 made of silicon, for example. Specifically, as in FIG. 10A, a plurality of n-channel MOS transistors Tr7 and Tr8 are formed in an inside region 100 forming each chip section in a semiconductor well region 91 formed in the second semiconductor wafer 90. Each of the MOS transistors Tr7 and Tr8 includes a pair of source/drain regions 93 and a gate electrode 94 formed on a gate insulating film. The MOS transistors Tr7 and Tr8 are isolated from each other by an element isolation region 92.

In FIG. 10F, the MOS transistors forming the logic circuit are represented by the MOS transistors Tr7 and Tr8. However, the logic circuit can be formed by a CMOS transistor. Thus, the plurality of MOS transistors can be formed as an n-channel MOS transistor or a p-channel MOS transistor. Hence, when an n-channel MOS transistor is formed, n-type source/drain regions are formed in a p-type semiconductor well region. When a p-channel MOS transistor is formed, p-type source/drain regions are formed in an n-type semiconductor well region.

Next, as in FIG. 10B, a wiring layer 95 is formed on the surface side of the second semiconductor wafer 90 by repeating the formation of an interlayer insulating film 96 and wiring 1M to 3M. Thereafter, as in FIGS. 10C to 10E, a passivation film 97, a buried film 89, and a film 98 to be polished are formed on the wiring layer 95, and a surface over the wiring layer 95 is planarized. Also on the surface side of the second semiconductor wafer 90, a level difference formed at a boundary between a peripheral region 101 and the inside region 100 is eliminated by being buried in the buried film 89, and the surface over the wiring layer 95 formed in the second semiconductor wafer 90 is planarized.

After the surface on the side of the wiring layer 95 in the second semiconductor wafer 90 is planarized, as shown in FIG. 10F, a bonding aid film 99 is formed to a thickness of 100 nm, for example, on the upper surface of the film 98 to be polished. The bonding aid film 99 includes a SiN film formed by introducing silane and nitrogen, a SiCN film formed by introducing 3TS (trimethylsilane) or 4TS (tetramethylsilane) and nitrogen, a SiO$_2$ film formed by introducing silane and oxygen, a SiCOH film formed by introducing 3TS (trimethylsilane) or 4TS (tetramethylsilane) and oxygen, and the like. This bonding aid film 99 is formed to aid in bonding when the first semiconductor wafer 76 and the second semiconductor wafer 90 are plasma-bonded to each other. Thus, the bonding aid film 99 may be formed on the surface on the side of the wiring layer 80 formed in the first semiconductor wafer 76, or the bonding aid film 99 may be formed on the surfaces of both of the first semiconductor wafer 76 and the second semiconductor wafer 90. While the formation of the bonding aid film 99 improves the reliability of the bonding, the bonding aid film 99 is not necessarily required, and the bonding aid film 99 may not be formed.

Then, the surface over the wiring layer 80 formed in the first semiconductor wafer 76 and the surface over the wiring layer 95 formed in the second semiconductor wafer 90 are irradiated with oxygen plasma for 60 seconds at a frequency of 13.56 MHz, a pressure of 10 Pa, and a power of 100 W, for example, so that the surfaces are modified. Thereafter, the surfaces are cleaned for 30 seconds with a pure water with 18 MΩ or more, whereby a silanol group (Si—OH group) is formed in the surface over the wiring layer 80 formed in the first semiconductor wafer 76 and the surface over the wiring layer 95 formed in the second semiconductor wafer 90.

Figure 10G:
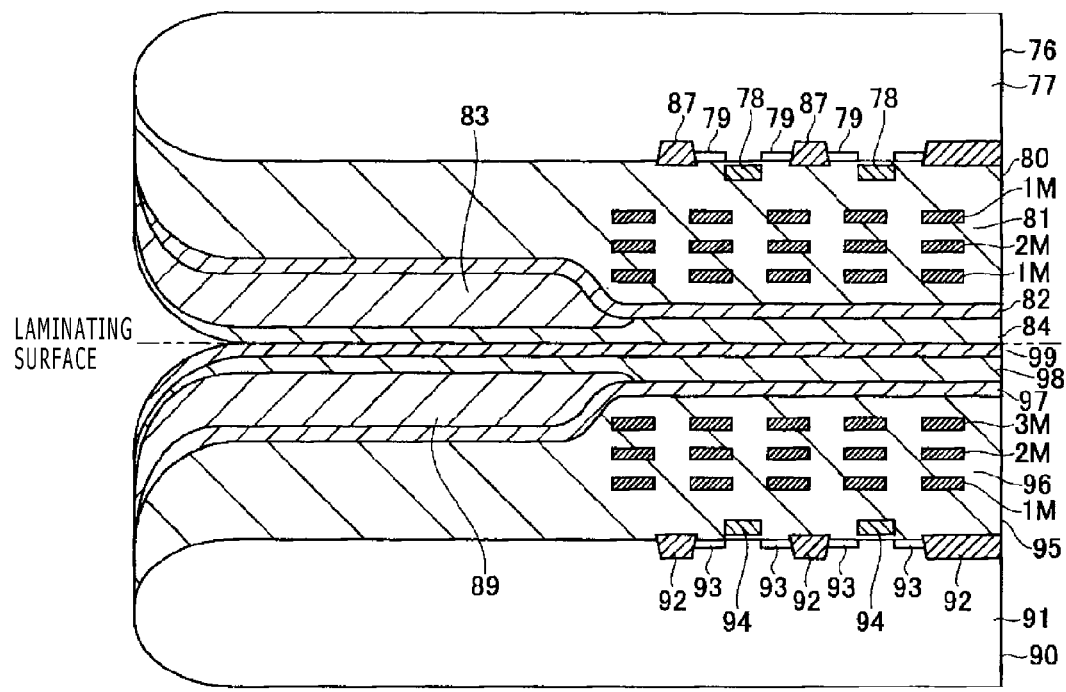

Next, as shown in FIG. 10G, the surface over the wiring layer 80 formed in the first semiconductor wafer 76 and the surface over the wiring layer 95 formed in the second semiconductor wafer 90 are opposed to each other as laminating surfaces. A part of the surface of one of the first semiconductor wafer 76 and the second semiconductor wafer 90 is then pressed by a pin. Then, the whole surfaces of the first semiconductor wafer 76 and the second semiconductor wafer 90 are bonded to each other by a Van der Waals force between the first semiconductor wafer 76 and the second semiconductor wafer 90. A heat treatment at about 400° C. is thereafter performed for about 60 minutes under an atmosphere of nitrogen at atmospheric pressure. Thereby, the silanol group in the surface over the wiring layer 80 formed in the first semiconductor wafer 76 and the silanol group in the surface over the wiring layer 95 formed in the second semiconductor wafer 90 are dehydration-condensed with each other, and bonding at a molecular level is completed.

In the example of the present embodiment, the surfaces over the wiring layers in the first semiconductor wafer 76 and the second semiconductor wafer 90 are made flat as far as the peripheral regions of the wafers. Thus, the first semiconductor wafer 76 and the second semiconductor wafer 90 are bonded to each other also in the peripheral regions, so that bonding strength is improved.

Figure 9:
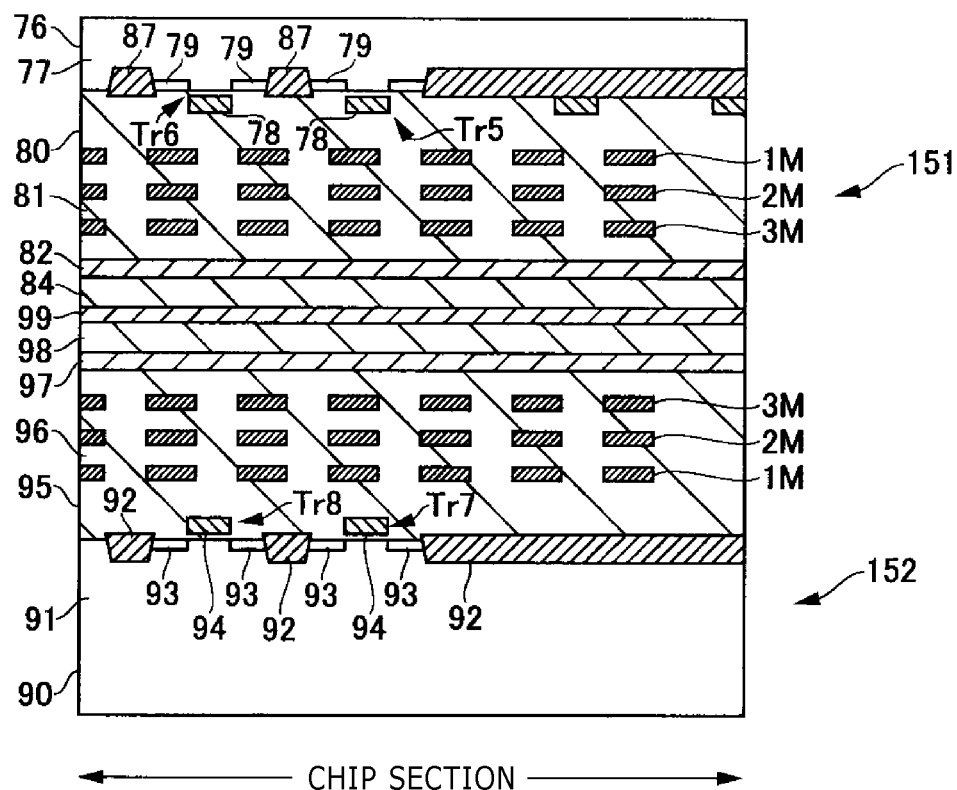
FIG. 9 is a sectional view of a constitution of a solid-state imaging device according to a fourth embodiment of the present technology.

After the completion of the bonding, in the region forming each chip section, a through hole not shown in the figure is formed from the back side of the first semiconductor wafer 76. Thereby a through electrode for electrically connecting the first semiconductor integrated circuit and the second semiconductor integrated circuit to each other is formed. In addition, an opening for exposing an electrode pad section not shown in the figure which electrode pad section is formed by a part of one piece of the wiring is formed. Thereafter, as in the first embodiment, the wafers are reduced in thickness, and divided into each chip section. The desired semiconductor device 150 shown in FIG. 9 is thereby obtained.

In the example of the present embodiment, the level difference over the wiring layer formed at the boundary between the peripheral region and the inside region in each of the first semiconductor wafer 76 and the second semiconductor wafer 90 is eliminated by the formation of a buried film. Thus, lamination with the upper parts of the wiring layers as laminating surfaces is performed in an excellent manner also in the peripheral regions of the semiconductor wafers, so that the adhesion and contact properties of the first semiconductor wafer 76 and the second semiconductor wafer 90 can be improved. Thereby, peeling of a laminating surface, chipping in a peripheral region, and the like are prevented in a polishing process after lamination and a dicing process, for example, so that reliability at the time of processing is improved. It is thereby possible to obtain a solid-state imaging device with high precision, and improve a yield.

In the example of the present embodiment, the first semiconductor wafer 76 and the second semiconductor wafer 90 are plasma-bonded to each other. However, as in the third embodiment, the first semiconductor wafer 76 and the second semiconductor wafer 90 may be bonded to each other via an adhesive layer in another example. In addition, in the example of the present embodiment, the surface over the wiring layer is planarized by locally forming a buried film using a coating material. However, as in the second embodiment, a buried film having a film thickness corresponding to a level difference may be formed over the entire surface by a CVD method. In this case, as shown in FIG. 6C, the surface of the buried film is planarized by etching back the buried film in the inside region.

The semiconductor devices such as solid-state imaging devices or the like according to the foregoing first to fourth embodiments are examples in which two semiconductor wafers each having a wiring layer are laminated to each other with the surface sides of the wiring layers as laminating surfaces. However, the present technology is not limited to this constitution. For example, a wiring layer may be formed in only one of two semiconductor wafers to be laminated to each other, and the two semiconductor wafers may be laminated to each other with a surface on the side of the wiring layer as a laminating surface. Also in this case, the entire surface over the wiring layer formed in the one semiconductor wafer is planarized, and therefore the one semiconductor wafer is laminated to the other semiconductor wafer in an excellent manner.

When two semiconductor wafers each having a wiring layer are laminated to each other with the surface sides of the wiring layers as laminating surfaces, there occurs a noticeable bonding defect in peripheral regions at a time of lamination due to level differences of the surfaces of the wiring layers which level differences are formed at boundaries between the peripheral regions and inside regions. Thus, the present technology produces greater effect when two semiconductor wafers each having a wiring layer are laminated to each other.

<5. Fifth Embodiment: Electronic Device>

Figure 11:
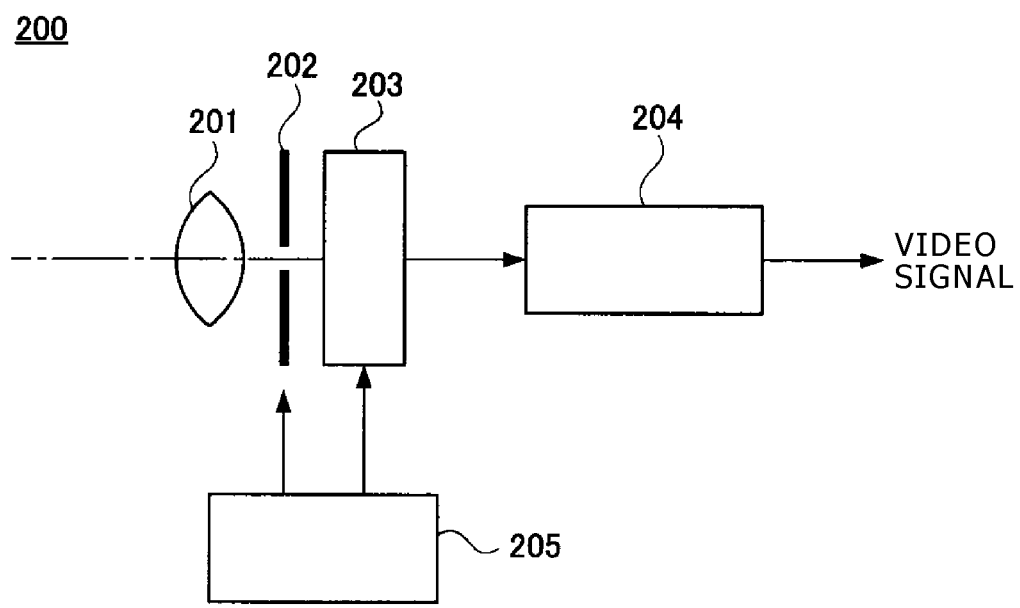
FIG. 11 is a diagram showing a constitution of an electronic device according to a fifth embodiment of the present technology.
Figure 12A:
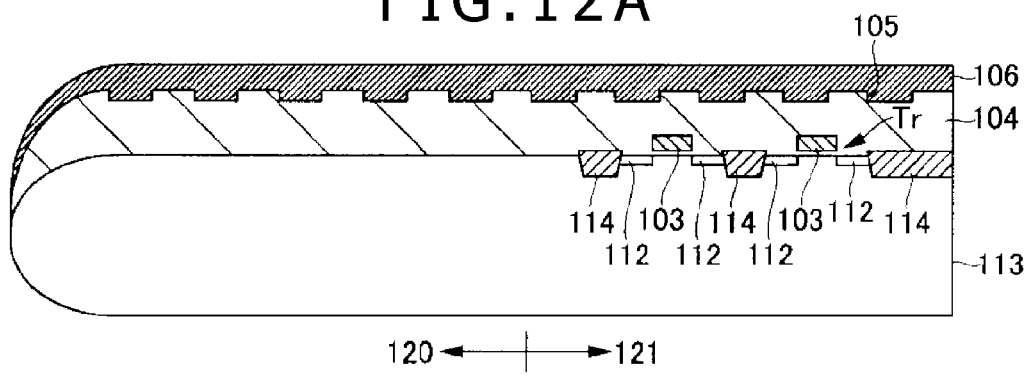
FIGS. 12A to 12G are process diagrams of a method for manufacturing a semiconductor device in the past.
Figure 12B:
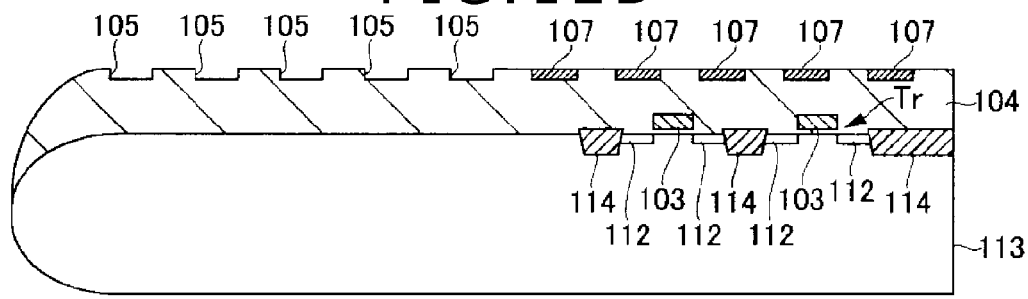
Figure 12C:
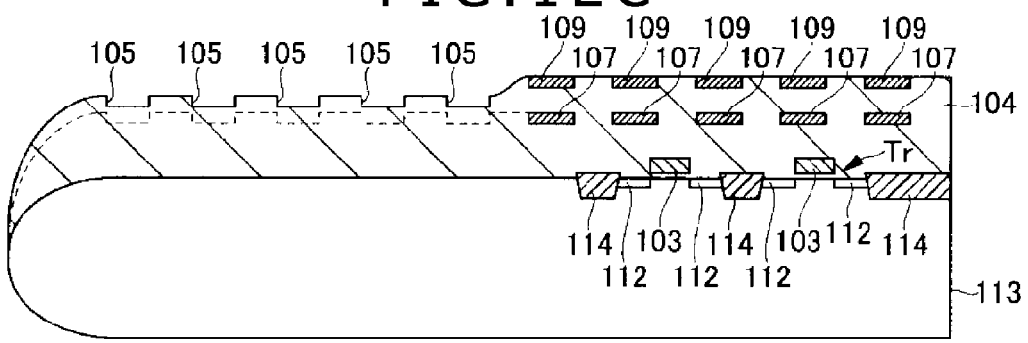
Figure 12D:
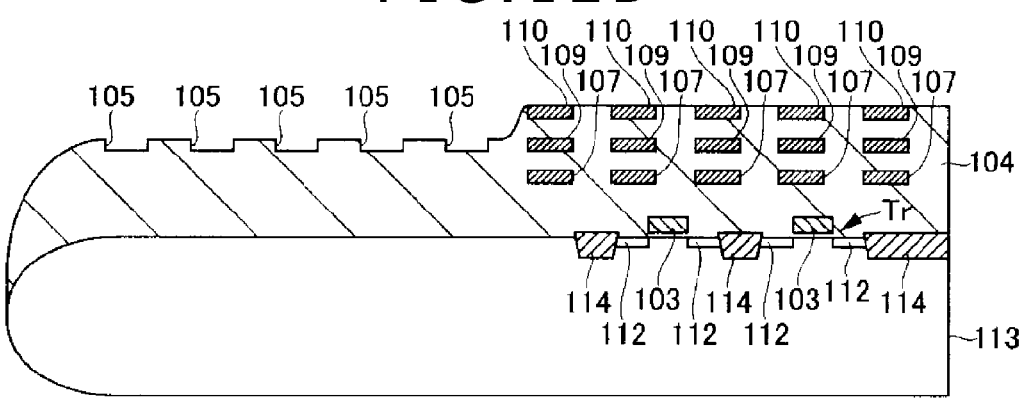
Figure 12E:
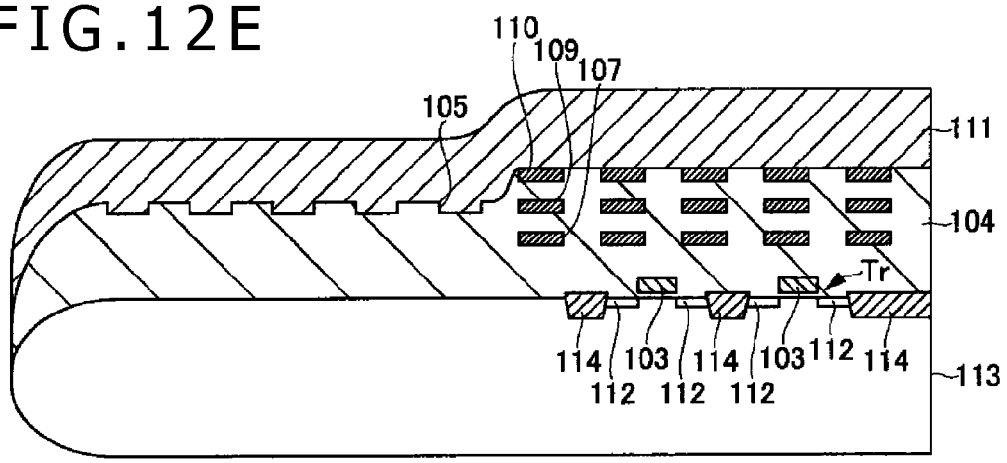
Figure 12F:
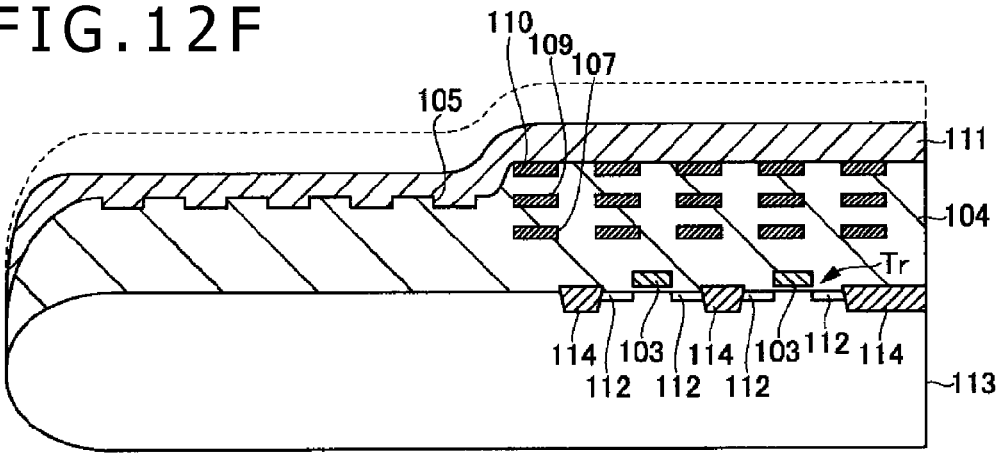
Figure 12G:
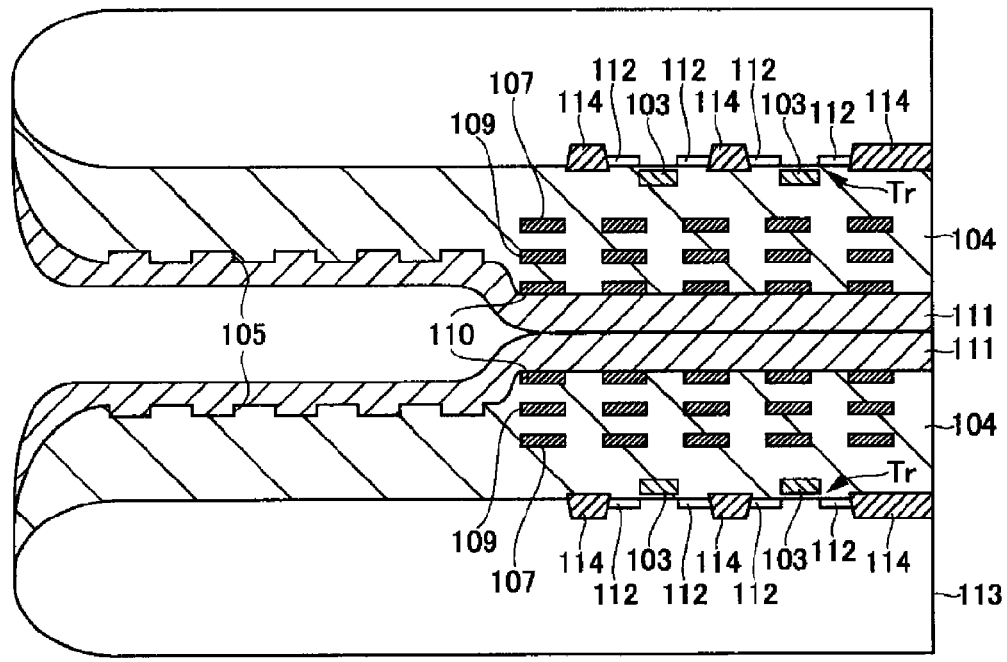

An electronic device according to a fifth embodiment of the present technology will next be described. FIG. 11 is a schematic block diagram of the electronic device 200 according to the fifth embodiment of the present technology.

The electronic device 200 according to an example of the present embodiment represents an embodiment in which the solid-state imaging device 1 according to the foregoing first embodiment of the present technology is used in an electronic device (camera).

The electronic device 200 according to the present embodiment includes a solid-state imaging device 203, an optical lens 201, a shutter device 202, a driving circuit 205, and a signal processing circuit 204.

The optical lens 201 forms an image of image light (incident light) from a subject onto the imaging surface of the solid-state imaging device 203. Thereby a corresponding signal charge is accumulated within the solid-state imaging device 203 in a certain period.

The shutter device 202 controls a period of irradiation of the solid-state imaging device 203 with light and a period of shielding the solid-state imaging device 203 from light.

The driving circuit 205 supplies a driving signal for controlling the transfer operation of the solid-state imaging device 203 and the shutter operation of the shutter device 202. The signal transfer of the solid-state imaging device 203 is performed according to the driving signal (timing signal) supplied from the driving circuit 205. The signal processing circuit 204 performs various signal processing. A video signal resulting from the signal processing is stored on a storage medium such as a memory or the like, or output to a monitor.

In the electronic device 200 according to the example of the present embodiment, peeling between wafers and chipping at a time of manufacturing are prevented in the solid-state imaging device 203. Therefore, a yield is improved, and cost is reduced. Thereby the cost of the electronic device can be reduced.

The electronic device 200 to which the solid-state imaging device 203 can be applied is not limited to a camera, but the solid-state imaging device 203 can be applied to imaging devices such as digital still cameras, camera modules for mobile devices including portable telephones, and the like.

The present disclosure contains subject matter related to that disclosed in Japanese Priority Patent Application JP 2011-036375 filed in the Japan Patent Office on Feb. 22, 2011, the entire content of which is hereby incorporated by reference.

It should be understood by those skilled in the art that various modifications, combinations, sub-combinations and alternations may occur depending on design requirements and other factors insofar as they are within the scope of the appended claims or the equivalent thereof.

What is claimed is:

1. A method for manufacturing a semiconductor device, the method comprising:
    forming a wiring layer on a surface side of a first semiconductor wafer;
    forming a buried film so as to fill in a level difference on said wiring layer, the level difference being formed at a boundary between a peripheral region of said first semiconductor wafer and an inside region of said first semiconductor wafer, the inside region being on an inside of the peripheral region, and the level difference being formed as a result of a surface over the wiring layer in said peripheral region being formed lower than a surface over the wiring layer in said inside region, and making the surfaces over the wiring layer in the peripheral region and the inside region substantially flush with each other,
    before forming the wiring layer on the surface side of said first semiconductor wafer,
    forming a pixel region in said first semiconductor wafer, the pixel region including a photoelectric conversion section for generating a signal charge corresponding to an amount of light received and a reading section for reading the signal charge generated in the photoelectric conversion section; and
    opposing and laminating the surfaces over the wiring layer formed in said first semiconductor wafer to a desired surface of a second semiconductor wafer, wherein a backside illumination type solid-state imaging device is manufactured.

2. The method for manufacturing the semiconductor device according to claim 1, wherein said buried film over said wiring layer formed in said first semiconductor wafer is formed by locally applying a desired coating material to the peripheral region of said first semiconductor wafer.

3. The method for manufacturing the semiconductor device according to claim 2, wherein after said buried film is formed, the surfaces over the wiring layer formed in said first semiconductor wafer are planarized by using a chemical mechanical polishing method.

4. The method for manufacturing the semiconductor device according to claim 3, wherein the buried film of said first semiconductor wafer is formed by forming an oxide film having a thickness for filling the level difference between the peripheral region and the inside region on the whole surfaces over the wiring layer formed in said first semiconductor wafer by using a plasma chemical vapor deposition method, and then etching back the oxide film in the inside region until a surface of the oxide film in the inside region is substantially flush with a surface of the oxide film in the peripheral region.

5. The method for manufacturing the semiconductor device according to claim 4, wherein after said buried film is formed, the surfaces over the wiring layer formed in said first semiconductor wafer are planarized by using a chemical mechanical polishing method.

6. The method for manufacturing the semiconductor device according to claim 1, further comprising:
    before laminating said first semiconductor wafer to said second semiconductor wafer,
    forming a wiring layer on a surface side of said second semiconductor wafer;
    forming a buried film so as to fill in a level difference on said wiring layer, the level difference being formed at a boundary between a peripheral region of said second semiconductor wafer and an inside region of said second semiconductor wafer, the inside region being on an inside of the peripheral region, and the level difference being formed as a result of a surface over the wiring layer in said peripheral region being formed lower than a surface over the wiring layer in said inside region, and making the surfaces over the wiring layer in the peripheral region and the inside region substantially flush with each other; and
    opposing and laminating the surfaces over the wiring layer formed in said first semiconductor wafer to the surfaces over the wiring layer formed in said second semiconductor wafer.

7. The method for manufacturing the semiconductor device according to claim 6, wherein said buried film over said wiring layer formed in said second semiconductor wafer is formed by locally applying a desired coating material to the peripheral region of said second semiconductor wafer.

8. The method for manufacturing the semiconductor device according to claim 7, wherein after said buried film over the wiring layer formed in said second semiconductor wafer is formed, the surfaces over the wiring layer formed in said second semiconductor wafer are planarized by using a chemical mechanical polishing method.

9. The method for manufacturing the semiconductor device according to claim 8, further comprising
    forming a plurality of transistors forming a logic circuit for processing a signal output from said pixel region in said second semiconductor wafer before forming the wiring layer on the surface side of said second semiconductor wafer.

10. The method for manufacturing the semiconductor device according to claim 1, wherein said first semiconductor wafer is laminated to said second semiconductor wafer by plasma bonding.

11. The method for manufacturing the semiconductor device according to claim 1, wherein said first semiconductor wafer is laminated to said second semiconductor wafer by a thermosetting adhesive.

12. The method for manufacturing the semiconductor device according to claim 1, wherein the buried film of said first semiconductor wafer is formed by forming an oxide film having a thickness for filling the level difference between the peripheral region and the inside region on the whole surfaces over the wiring layer formed in said first semiconductor wafer by using a plasma chemical vapor deposition method, and then etching back the oxide film in the inside region until a surface of the oxide film in the inside region is substantially flush with a surface of the oxide film in the peripheral region.

13. The method for manufacturing the semiconductor device according to claim 12, wherein after said buried film is formed, the surfaces over the wiring layer formed in said first semiconductor wafer are planarized by using a chemical mechanical polishing method.

14. A semiconductor device formed by:
- forming a wiring layer on a surface side of a first semiconductor wafer;
- forming a buried film so as to fill in a level difference on said wiring layer, the level difference being formed at a boundary between a peripheral region of said first semiconductor wafer and an inside region of said first semiconductor wafer, the inside region being on an inside of the peripheral region, and the level difference being formed as a result of a surface over the wiring layer in said peripheral region being formed lower than a surface over the wiring layer in said inside region, and making the surfaces over the wiring layer in the peripheral region and the inside region substantially flush with each other,
- wherein a pixel region including a photoelectric conversion section for generating a signal charge corresponding to an amount of light received and a reading section for reading the signal charge generated in the photoelectric conversion section is formed in said first semiconductor wafer, and the semiconductor device is a backside illumination type solid-state imaging device; and
- opposing and laminating the surfaces over the wiring layer formed in said first semiconductor wafer to a desired surface of a second semiconductor wafer.

15. The semiconductor device according to claim 14, wherein the semiconductor device is formed by:
- before laminating said first semiconductor wafer to said second semiconductor wafer,
- forming a wiring layer on a surface side of said second semiconductor wafer;
- forming a buried film so as to fill in a level difference on said wiring layer, the level difference being formed at a boundary between a peripheral region of said second semiconductor wafer and an inside region of said second semiconductor wafer, the inside region being on an inside of the peripheral region, and the level difference being formed as a result of a surface over the wiring layer in said peripheral region being formed lower than a surface over the wiring layer in said inside region, and making the surfaces over the wiring layer in the peripheral region and the inside region substantially flush with each other; and
- opposing and laminating the surfaces over the wiring layer formed in said first semiconductor wafer to the surfaces over the wiring layer formed in said second semiconductor wafer.

16. The semiconductor device according to claim 14, wherein a plurality of transistors forming a logic circuit for processing a signal output from said pixel region is formed in said second semiconductor wafer.

17. A method for laminating semiconductor wafers, the method comprising:
- forming a wiring layer on a surface side of a first semiconductor wafer;
- forming a buried film so as to fill in a level difference on said wiring layer, the level difference being formed at a boundary between a peripheral region of said first semiconductor wafer and an inside region of said first semiconductor wafer, the inside region being on an inside of the peripheral region, and the level difference being formed as a result of a surface over the wiring layer in said peripheral region being formed lower than a surface over the wiring layer in said inside region, and making the surfaces over the wiring layer in the peripheral region and the inside region substantially flush with each other,
- wherein a pixel region including a photoelectric conversion section for generating a signal charge corresponding to an amount of light received and a reading section for reading the signal charge generated in the photoelectric conversion section is formed in said first semiconductor wafer; and
- opposing and laminating the surfaces over the wiring layer formed in said first semiconductor wafer to a desired surface of a second semiconductor wafer.

18. An electronic device comprising:
- an optical lens;
- a solid-state imaging device for receiving incident light condensed by said optical lens, the solid-state imaging device being formed by forming a pixel region in a first semiconductor wafer, forming a wiring layer on a surface side of said first semiconductor wafer, forming a buried film so as to fill in a level difference on said wiring layer, the level difference being formed at a boundary between a peripheral region of said first semiconductor wafer and an inside region of said first semiconductor wafer, the inside region being on an inside of the peripheral region, and the level difference being formed as a result of a surface over the wiring layer in the peripheral region being formed lower than a surface over the wiring layer in the inside region, making the surfaces over the wiring layer in the peripheral region and the inside region substantially flush with each other, and opposing and laminating the surfaces over the wiring layer formed in said first semiconductor wafer to a desired surface of a second semiconductor wafer; and
- a signal processing circuit for processing an output signal output from said solid-state imaging device.

* * * * *